US012813087B2

(12) United States Patent
Hwang et al.

(10) Patent No.: US 12,813,087 B2
(45) Date of Patent: Nov. 24, 2026

(54) DISPLAY DEVICE

(71) Applicant: LG Display Co., Ltd., Seoul (KR)

(72) Inventors: Yooji Hwang, Siheung-si (KR); Yongmin Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 492 days.

(21) Appl. No.: 18/494,380

(22) Filed: Oct. 25, 2023

(65) Prior Publication Data

US 2024/0196662 A1 Jun. 13, 2024

(30) Foreign Application Priority Data

Dec. 8, 2022 (KR) ........................ 10-2022-0170748

(51) Int. Cl.

| | |
|---|---|
| ***H10K 59/122*** | (2023.01) |
| ***H10K 59/35*** | (2023.01) |
| ***H10K 59/65*** | (2023.01) |
| ***H10K 59/80*** | (2023.01) |

(52) U.S. Cl.

CPC ......... *H10K 59/122* (2023.02); *H10K 59/352* (2023.02); *H10K 59/353* (2023.02); *H10K 59/65* (2023.02); *H10K 59/873* (2023.02)

(58) Field of Classification Search

CPC ....... H10K 59/122; H10K 59/352–353; H10K 59/65; H10K 59/873; H10K 59/121; H10K 59/12; H10K 59/20; H10K 59/80518; H10K 59/124; H10K 50/813; H10K 50/82; H10K 50/844; H10K 50/856

See application file for complete search history.

(56) References Cited

U.S. PATENT DOCUMENTS

| | | | | |
|---|---|---|---|---|
| 10,763,317 | B2 | 9/2020 | Lee et al. | |
| 11,342,394 | B2 | 5/2022 | Lee et al. | |
| 12,200,976 | B2 * | 1/2025 | Yun | H10K 59/35 |
| 2017/0125740 | A1 * | 5/2017 | Lee | H10K 59/80515 |
| 2017/0213882 | A1 | 7/2017 | Teramoto et al. | |
| 2018/0225500 | A1 | 8/2018 | Han | |
| 2020/0203447 | A1 | 6/2020 | Lee et al. | |
| 2020/0350380 | A1 | 11/2020 | Lee et al. | |

(Continued)

FOREIGN PATENT DOCUMENTS

| | | | |
|---|---|---|---|
| KR | 10-2018-0092003 | A | 8/2018 |
| KR | 10-2087103 | B1 | 3/2020 |

(Continued)

*Primary Examiner* — Anne M Hines
*Assistant Examiner* — Jose M Diaz
(74) *Attorney, Agent, or Firm* — Fenwick & West LLP

(57) ABSTRACT

A display device includes a display area having a first display area comprising a transmission area and a non-transmission area, a transistor in the non-transmission area, a planarization layer above the transistor, a first bank on the planarization layer and including a first open area and a second open area, an anode electrode on a side portion of the first bank and the first open area and the second open area, a second bank that covers a part of the anode electrode and has a third open area and a fourth open area, respectively, a first organic layer and a second organic layer on the anode electrode in the third open area and the fourth open area, respectively, and a cathode electrode on the first organic layer and the second organic layer to improve the efficiency deviation between the first display area and the second display area.

31 Claims, 11 Drawing Sheets

(56) References Cited

U.S. PATENT DOCUMENTS

| | | | |
|---|---|---|---|
| 2020/0373520 | A1 | 11/2020 | Kim et al. |
| 2022/0005900 | A1 | 1/2022 | You et al. |
| 2022/0246700 | A1 | 8/2022 | Lee et al. |

FOREIGN PATENT DOCUMENTS

| | | | |
|---|---|---|---|
| KR | 10-2020-0135068 | A | 12/2020 |
| KR | 10-2022-0003693 | A | 1/2022 |

* cited by examiner

DISPLAY DEVICE

CROSS-REFERENCE TO RELATED APPLICATIONS

This application claims the priority of Republic of Korea Patent Application No. 10-2022-0170748 filed on Dec. 8, 2022, in the Korean Intellectual Property Office, which is hereby incorporated by reference in its entirety.

BACKGROUND

Field

The present disclosure relates to a display device.

Description of the Related Art

As the information era is entered, a field of a display device which visually expresses electrical information signals has been rapidly developed and studies are continued to improve performances of various display devices, such as a thin-thickness, a light weight, and low power consumption.

A representative display device may include a liquid crystal display (LCD) device, a field emission display (FED) device, an electro-wetting display (EWD) device, an organic light emitting display (OLED) device, and the like.

An electroluminescent display device which is represented by an organic light emitting display device is a self-emitting display device so that a separate light source is not necessary, which is different from a liquid crystal display device. Therefore, the electroluminescent display device may be manufactured to have a light weight and a small thickness compared to the liquid crystal display device. Further, since the electroluminescent display device is advantageous not only in terms of power consumption due to the low voltage driving, but also in terms of color implementation, a response speed, a viewing angle, a contrast ratio (CR), it is expected to be utilized in various fields.

The electroluminescent display device configures a light emitting diode by disposing a plurality of organic layers each including an emission layer between two electrodes of an anode electrode and a cathode electrode. For example, when holes are injected from the anode electrode into the emission layer and electrons are injected from the cathode electrode into the emission layer, the injected holes and electrons are recombined in the emission layer to form excitons and emit light.

In the meantime, efforts are continued to reduce a bezel area which is an outer periphery of the display area to increase an effective display screen size with the same area of the display device.

However, in the bezel area corresponding to the non-display area, a wiring line and a driving circuit for driving the screen are disposed so that there is a limitation in reducing the bezel area.

SUMMARY

In accordance with the development of the technology, the display device may provide an image capturing function and a proximity sensing function as well as an image displaying function. To this end, the display device needs to include a light receiving device such as a camera or a proximity sensor.

The receiving device needs to receive light on the front surface of the display device so that it needs to be installed in a place where it is advantageous to receive light. Accordingly, in the related art, a camera (a camera lens) and a proximity lens need to be installed on the front surface of the display device to be exposed. Therefore, a bezel of the display device is increased or a notch portion or a hole is formed in a display area of the display panel so that the camera lens or the proximity sensor is installed therein. As described above, when the light receiving device which receives light of the front surface to perform a determined function, such as a camera or a proximity sensor, is provided in the display device, there are problems in that a bezel of the front surface of the display device is increased or a design of the front surface of the display device is restricted.

Therefore, an object to be achieved by the present disclosure is to provide a display device in which a light receiving device (for example, a camera or a proximity sensor) is disposed behind a display panel so that the light receiving device which needs to receive light from the front surface is not exposed to the front surface.

In the meantime, in order to ensure a transmission area, a technique of reducing the number of pixels of a first display area which overlaps the light receiving device may be applied. However, by doing this, there may be an efficiency deviation between the first display area which overlaps the light receiving device and the remaining second display area.

Accordingly, another object to be achieved by the present disclosure is to provide a display device which ensures the transmission area in the first display area and improves the efficiency deviation between the first display area and the second display area.

Further, still another object to be achieved by the present disclosure is to provide a display device which improves degradation of a sharpness and a color sense and improves a viewing angle.

Objects of the present disclosure are not limited to the above-mentioned objects, and other objects, which are not mentioned above, can be clearly understood by those skilled in the art from the following descriptions.

In one embodiment, a display device comprises: a display area including a first display area and a second display area, the first display area including a transmission area and a non-transmission area: a transistor in the non-transmission area of the first display area: a planarization layer above the transistor; a first bank on the planarization layer, the first bank including a first open area and a second open area: an anode electrode on a side portion of the first bank, the first open area, and the second open area: a second bank that covers a part of the anode electrode on the side portion of the first bank and includes a third open area and a fourth open area, the third open area overlapping the first open area and the fourth open area overlapping the second open area: a first organic layer on the anode electrode in the third open area and a second organic layer on the anode electrode in the fourth open area: a cathode electrode on the first organic layer and the second organic layer: and an encapsulation layer on the cathode electrode.

In one embodiment, a display device comprises: a display area including a first display area and a second display area, the first display area including a transmission area and a non-transmission area: a first light emitting diode in the non-transmission area and is a main emission area that emits light; a second light emitting diode around the first light emitting diode and is an auxiliary emission area that emits light; a main reflective emission area between the main emission area and the auxiliary emission area, the main reflective emission area reflecting the light emitted from the main emission area; and an auxiliary reflective emission area around the auxiliary emission area, the auxiliary emission area reflecting the light emitted from the auxiliary emission area.

In one embodiment, a display device comprising: a display area including a first display area and a second display area, the second display area less light transmissive than the first display area: a transistor in the first display area: a planarization layer on the transistor in the first display area: a first bank in the first display area, the first bank including a first open area such that the first bank includes a first top surface and a first side surface that extends from the first top surface to the planarization layer: an anode electrode that is connected to the transistor, the anode electrode including a first portion that is on the first side surface of the first bank and contacts a first portion of the planarization layer in the first open area; a second bank over the first portion of the anode electrode that is on the first side surface of the first bank, the second bank including a second open area that overlaps the first open area: a first organic layer on the first portion of the anode electrode in the second open area: and a cathode electrode including a first portion that is on a first side surface of the second bank and on the first organic layer.

Other detailed matters of the exemplary embodiments are included in the detailed description and the drawings.

According to the present disclosure, a display device in which a light receiving device is located behind the display panel so that the light receiving device which needs to receive light from the front surface is not exposed to the front surface is provided. Therefore, a bezel of the front surface of the display device is reduced and a front surface design of the display device may be improved.

According to the present disclosure, when a light receiving device is located behind the display panel, a transmission area is additionally ensured in the first display area which overlaps the light receiving device to satisfactorily transmit light from the front surface of the display panel to the light receiving device through the display panel. Therefore, an image quality of the light receiving device may be improved.

According to the present disclosure, the degradation of the sharpness and the color sense of the first display area may be improved and a luminous efficiency and the viewing angle in the first display area may be improved.

The effects according to the present disclosure are not limited to the contents exemplified above, and more various effects are included in the present specification.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
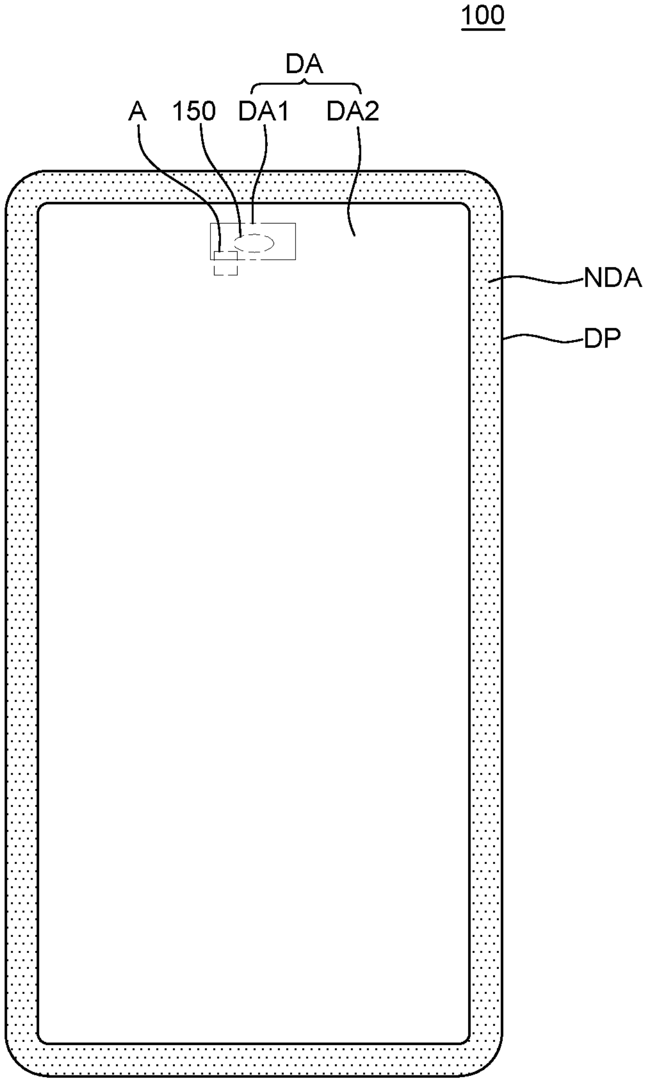
FIG. 1 is a plan view schematically illustrating a display device according to an exemplary embodiment of the present disclosure.

Advantages and characteristics of the present disclosure and a method of achieving the advantages and characteristics will be clear by referring to exemplary embodiments described below in detail together with the accompanying drawings. However, the present disclosure is not limited to the exemplary embodiments disclosed herein but will be implemented in various forms. The exemplary embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is disposed "on" another element or layer, another layer or another element may be interposed directly on the other element or therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

FIG. 1 is a plan view schematically illustrating a display device according to an exemplary embodiment of the present disclosure.

Referring to FIG. 1, a display device 100 according to an exemplary embodiment of the present disclosure may include a display panel DP which displays images and a light receiving device 150 which receives external light.

The display panel DP is a panel for displaying images to a user.

The display panel DP may include a display element which displays images, a driving element which drives the display element, and wiring lines which transmit various signals to the display element and the driving element. The display element may be defined in different ways depending on a type of the display panel DP. For example, when the display panel DP is an electroluminescent display panel, the display element may be an electroluminescent element which includes an anode electrode, an organic layer, and a cathode electrode. For example, when the display panel DP is a liquid crystal display panel, the display element may be a liquid crystal display element.

Hereinafter, even though the display panel DP is assumed as an electroluminescent display panel, the display panel DP is not limited to the electroluminescent display panel.

In the meantime, the display panel DP may be configured to include a substrate, a plurality of insulating films, a transistor layer, and a light emitting diode layer on the substrate. The display panel DP may include a plurality of sub pixels for displaying images and various signal lines for driving the plurality of sub pixels. The signal lines may include a plurality of data lines, a plurality of gate lines, a plurality of power lines, and the like. At this time, each of the plurality of sub pixels may include a transistor located on the transistor layer and a light emitting diode located on the light emitting diode layer.

The display panel DP may include a display area DA and a non-display area NDA.

The display area DA is an area where images are displayed in the display panel DP.

In the display area DA, a plurality of sub pixels which configure the plurality of pixels and a circuit for driving the plurality of sub pixels may be disposed. The plurality of sub pixels are minimum units which configure the display area DA and a display element may be disposed in each of the plurality of sub pixels. The plurality of sub pixels may configure a pixel. For example, an electroluminescent element which includes an anode electrode, an organic layer, and a cathode electrode may be disposed in each of the plurality of sub pixels, but it is not limited thereto. Further, a circuit for driving the plurality of sub pixels may include a driving element and a wiring line. For example, the circuit may be configured by a thin film transistor, a storage capacitor, a gate line, a data line, and the like, but is not limited thereto.

The non-display area NDA is an area where no image is displayed.

The non-display area NDA is bent so as not to be seen from a front surface or blocked by a case (not illustrated) and is also referred to as a bezel area.

Even though in FIG. 1, it is illustrated that the non-display area NDA encloses a quadrangular display area DA, shapes and placements of the display area DA and the non-display area NDA are not limited to the example illustrated in FIG. 1. That is, the display area DA and the non-display area NDA may have shapes suitable for a design of an electronic device including the display device 100. For example, an exemplary shape of the display area DA may be a pentagon, a hexagon, a circle, an oval, or the like.

In the non-display area NDA, various wiring lines and circuits for driving the electroluminescent element of the display area DA may be disposed. For example, in the non-display area NDA, a link line which transmits signals to the plurality of sub pixels and circuits of the display area DA, a gate-in-panel (GIP) line, or a driving IC, such as a gate driver IC or a data driver IC, may be disposed, but it is not limited thereto.

The display device 100 may further include various additional elements to generate various signals or drive the pixel in the display area AA. The additional elements for driving the pixels may include an inverter circuit, a multiplexer, an electrostatic discharge circuit (ESD), or the like. Further, the display device 100 may further include an additional element associated with a function other than a pixel driving function. For example, the display device 100 may include additional elements which provide a touch sensing function, a user authentication function (for example, fingerprint recognition), a multilevel pressure sensing function, or a tactile feedback function. The above-mentioned additional elements may be located in an external circuit which is connected to the non-display area NDA and/or the connecting interface.

In the meantime, referring to FIG. 1, the display area DA may include a first display area DA1 and a second display area DA2, but is not limited thereto. In one embodiment, the second display area DA2 surrounds the first display area DA1 in a plan view of the display device 100.

The light receiving device 150 is a device which receives light (e.g., external light) to perform a determined function. For example, the light receiving device 150 may include one or more of cameras and proximity sensors.

The light receiving device 150 is a device which requires light reception, but may be disposed behind (below) the display panel DP. For example, the light receiving device 150 may be disposed in an opposite side to a viewing surface of the display panel DP. For example, the light receiving device 150 is not exposed to the front surface of the display device 100. Accordingly, when a user views a front surface of the display device 110, the light receiving device 150 is not seen.

Here, a camera which is located behind (below) the display panel DP is a front camera which captures the front camera and may also be considered as a camera lens.

The light receiving device 150 may be disposed so as to overlap the display area DA of the display panel DP. For example, the light receiving device 150 may be disposed in the display area DA.

Here, an area overlapping the light receiving device 150 in the display area DA is referred to as a first display area DA1 and the other area is referred to as a second display area DA2. Therefore, the light receiving device 150 may be located to overlap the first display area DA1 of the display area DA. In other words, the light receiving device 150 may be located in the first display area DA1 of the display area DA but not the second display area DA2. The first display area DA1 is an area overlapping the light receiving device 150 so that a transmittance of the first display area DA1 of the display area DA needs to be better than the transmittance of the second display area DA2 which does not overlap the light receiving device 150.

In order to improve the transmittance of the first display area DA1 which overlaps the light receiving device 150, the first display area DA1 and the second display area DA2 may have different resolution, different sub pixel placement structures, different number of sub pixels for every unit area, different electrode structures, different line structures, different electrode placement structures, or different wiring line placement structures. However, the present disclosure is not limited thereto.

For example, the number of sub pixels for every unit area in the first display area DA1 may be less than the number of sub pixels for every unit area in the second display area DA2. Accordingly, a resolution of the first display area DA1 may be less than a resolution of the second display area DA2. For example, in the second display area DA2, pixels per inch (PPI) is 400 or higher, but in the first display area DA1, PPI may be 200 or higher, but is not limited thereto.

As the light receiving device 150 is located below the display panel DP without being exposed to the outside, the camera is referred to as an under-display camera (UDC). As the light receiving device 150, an infrared (IR) sensor is also referred to as an under-display IR sensor (UDIR). However, the present disclosure is not applied only to the above-described UDC model or UDIR model.

In the case of the display device 100 according to the exemplary embodiment of the present disclosure, a bezel width may be smaller and a notch type display panel 110 does not need to be manufactured. Further, there is no restriction in the design due to the light receiving device 150 so that a degree of freedom of design may be increased.

In the meantime, even though in the display device 100 according to the exemplary embodiment of the present disclosure, the light receiving device 150 is located behind the display panel 110, the light receiving device 150 needs to normally receive light and perform the determined function. Further, even though in the display device 100 according to the exemplary embodiment of the present disclosure, the light receiving device 150 is located behind the display panel 110 and overlaps the display area DA, the light receiving device 150 needs to normally receive light and perform the determined function. Further, the image needs to be normally displayed in the display area DA.

Accordingly, the display device 100 according to the exemplary embodiment of the present disclosure may have a structure which improves a transmittance of the first display area DA1 overlapping the light receiving device 150.

Figure 2:
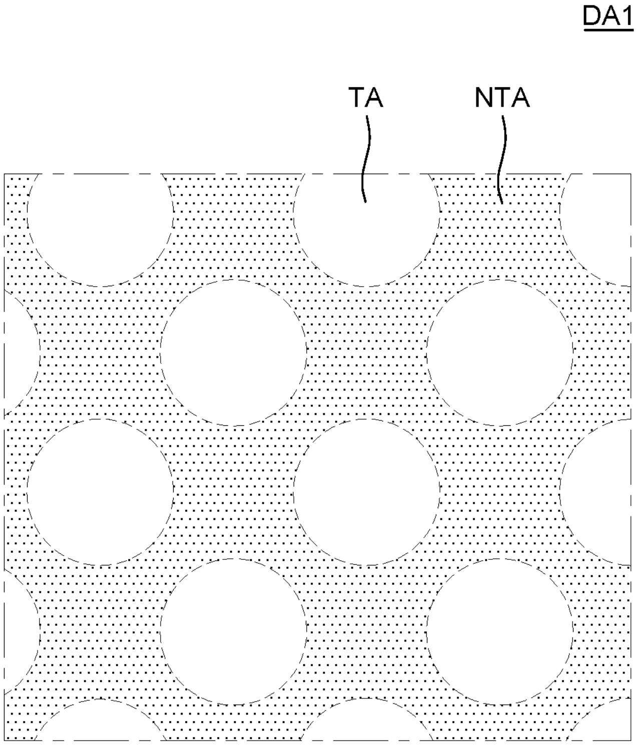
FIG. 2 is a view illustrating a first display area of a display device of FIG. 1 according to an exemplary embodiment of the present disclosure.

FIG. 2 is a view illustrating a first display area of a display device of FIG. 1 according to an exemplary embodiment of the present disclosure.

Figure 3:
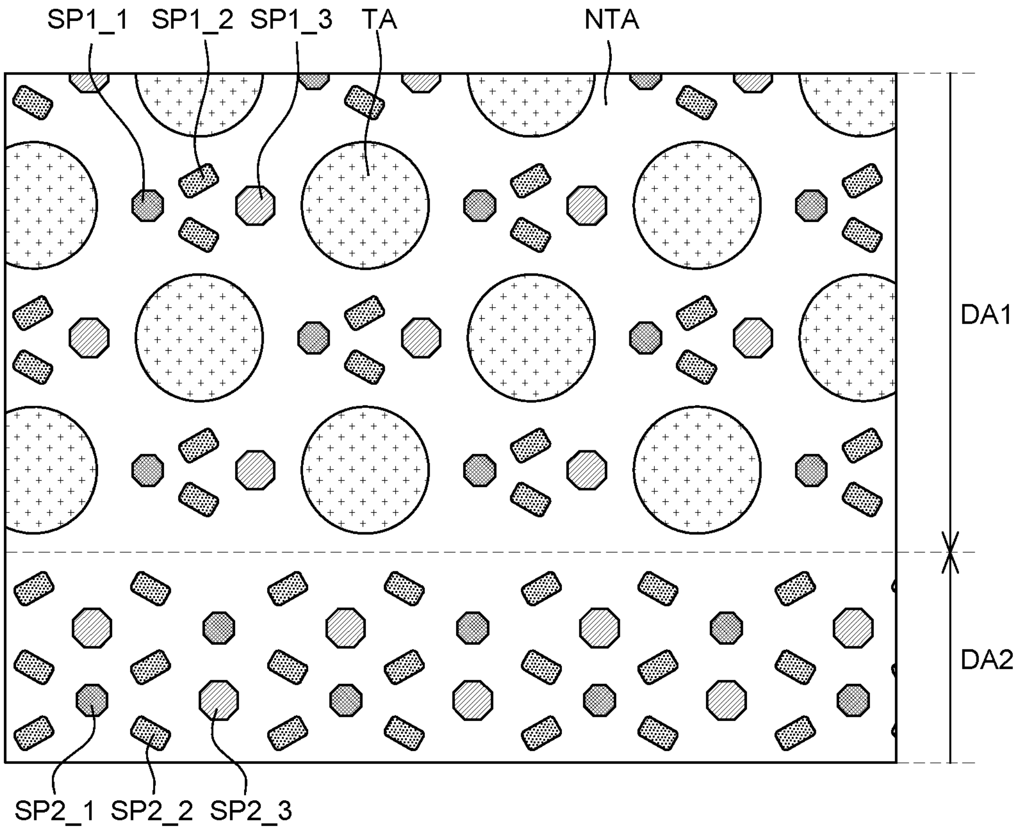
FIG. 3 is a view illustrating a part A of FIG. 1 according to an exemplary embodiment of the present disclosure.

FIG. 3 is a view illustrating a part A of FIG. 1 according to an exemplary embodiment of the present disclosure.

In FIG. 3, as compared with FIG. 2, a part of the second display area DA2 and a pixel structure are additionally illustrated.

Referring to FIGS. 2 and 3, the display area may include a first display area DA1 overlapping the light receiving device and a second display area DA2 which is the remaining area.

The first display area DA1 may overlap the light receiving device 150.

The first display area DA1 may include a non-transmission area NTA and a transmission area TA. As described above, in the UDC model and the UDIR model, the first display area DA1 includes both an emission area for display, that is, the non-transmission area NTA and a transmission area TA in which the light receiving device 150 receives light.

The transmission area TA is a partial area which is included in the first display area DA1 and as an opaque configuration, such as the cathode electrode, is removed, external light may be transmitted to the light receiving device. For example, the transmission area TA may have a circular or oval shape, and is also referred to as a hole area.

Further, the non-transmission area NTA is the other partial area included in the first display area DA1 and a transistor of the transistor layer and a light emitting diode of the light emitting diode layer may be disposed in the non-transmission area NTA.

The non-transmission area NTA may include a pixel area in which a plurality of sub pixels SP1_1, SP1_2, SP1_3: SP2_1, SP2_2, and SP2_3 is provided and a wiring area in which various signal lines are disposed.

When the transmission area TA is enclosed by the non-transmission area NTA, the first display area DA1 may include a plurality of separated transmission areas TA, but is not limited thereto.

In the first display area DA1, a plurality of first sub pixels SP1_1, SP1_2, and SP1_3 may be disposed in the pixel area. Further, for example, the first sub pixels SP1_1, SP1_2, and SP1_3 may include a first-first sub pixel SP1_1, a first-second sub pixel SP1_2, and a first-third sub pixel SP1_3.

In the second display area DA2, a plurality of second sub pixels SP2_1, SP2_2, and SP2_3 may be disposed in the pixel area. Further, for example, the second sub pixels SP2_1, SP2_2, and SP2_3 may include a second-first sub pixel SP2_1, a second-second sub pixel SP2_2, and a second-third sub pixel SP2_3.

For example, the first-first sub pixel SP1_1 and the second-first sub pixel SP2_1 may be red sub pixels.

For example, the first-second sub pixel SP1_2 and the second-second sub pixel SP2_2 may be green sub pixels.

For example, the first-third sub pixel SP1_3 and the second-third sub pixel SP2_3 may be blue sub pixels.

For example, the first-first sub pixel SP1_1 and the second-first sub pixel SP2_1 and the first-third sub pixel SP1_3 and the second-third sub pixel SP2_3 may have a circular shape or a polygonal shape, but are not limited thereto.

For example, the first-second sub pixel SP1_2 and the second-second sub pixel SP2_2 may have an oval shape or a substantial rectangular shape, but are not limited thereto.

In FIG. 3, it is illustrated that one first-first sub pixel SP1_1, two first-second sub pixels SP1_2 and one first-third sub pixel SP1_3 are gathered to form one first pixel, and one second-first sub pixel SP2_1, two second-second sub pixels SP2_2, and one second-third sub pixel SP2_3 are gathered to form one second pixel as an example. However, the present disclosure is not limited thereto.

Further, each of the first pixel disposed in the first display area DA1 and the second pixel disposed in the second display area DA2 have a rhombus shape, but are not limited thereto.

Further, the first pixel disposed in the first display area DA1 may be disposed to be enclosed by four transmission areas TA, but is not limited thereto.

As seen from FIG. 3, it is understood that the first pixel disposed in the first display area DA1 has the pixels per inch (PPI) lower than the second pixel disposed in the second display area DA2. Therefore, the transmittance of the first display area DA1 which overlaps the light receiving device may be improved.

As described above, in the present disclosure, in order to ensure the transmission area TA, the number of first pixels of the first display area DA1 which overlaps the light receiving device may be reduced. However, by doing this, the efficiency deviation between the first display area DA1 and the second display area DA2 is caused. Specifically, the visibility at the boundary of the first display area DA1 and the second display area DA2 may become a problem.

Therefore, in the present disclosure, a side mirror (SM) structure in which in the first sub pixels SP1_1, SP1_2, and SP2_3 of the first display area DA1, a mirror-shaped anode electrode is added on a side surface of the emission layer may be applied. Therefore, the light extraction efficiency of the first display area DA1 is improved to reduce the efficiency deviation and the visibility difference between the first display area DA1 and the second display area DA2 and the visibility difference between the transmission area TA and the non-transmission area NTA in the first display area DA1. By doing this, the degradation of the sharpness and the color sense is improved and the transmission area TA in which the light receiving device receives light is additionally ensured to improve an image quality of the light receiving device.

Further, in the present disclosure, a partition is added in the SM structure to form a double SM structure with a first SM structure and a second SM structure to improve the luminous efficiency and the viewing angle. As described above, the double SM structure by the partition is formed at the outside of the first sub pixels SP1_1, SP1_2, and SP1_3 in the vicinity of the transmission area TA to improve the color viewing angle. Between the SM structures, the large first SM structures serves to improve the luminous efficiency and the small second SM structure may serve to improve the viewing angle.

At this time, in the second display area DA2, each emission area corresponds to the second sub pixels SP2_1, SP2_2, and SP2_3, respectively. In contrast, in the first display area DA1, a reflective emission area is added by the SM structure in addition to the main emission area so that each emission area may be expanded as compared with in the first sub pixels SP1_1, SP1_2, and SP1_3. The SM structure will be described in detail with reference to FIGS. 7A and 7B to 9.

Figure 4:
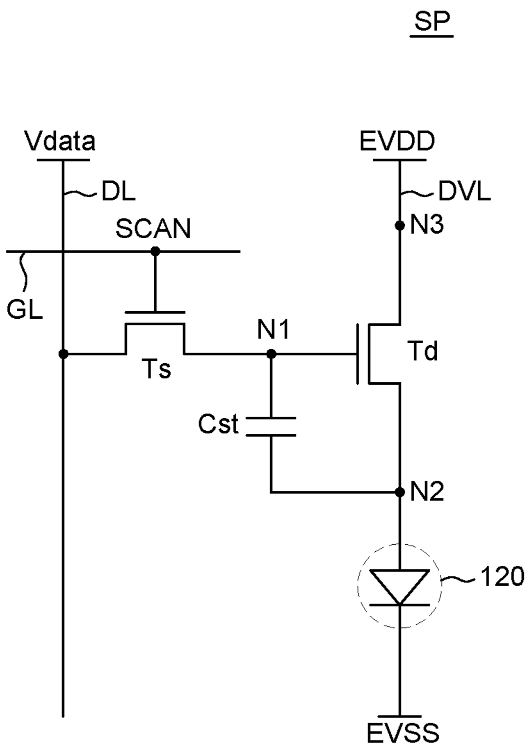
FIG. 4 is an equivalent circuit diagram of one sub pixel of a display device according to an exemplary embodiment of the present disclosure.

FIG. 4 is an equivalent circuit diagram of one sub pixel of a display device according to an exemplary embodiment of the present disclosure.

Referring to FIG. 4, in the display device according to the exemplary embodiment of the present disclosure, each of the plurality of sub pixels SP disposed in the display panel may include a light emitting diode 120, a driving transistor Td, a scan transistor Ts, a storage capacitor Cst, and the like.

At this time, the light emitting diode 120 may include a pixel electrode, a common electrode, and a plurality of organic layers located between the pixel electrode and the common electrode. The pixel electrode is disposed in each sub pixel SP and the common electrode may be commonly disposed in the plurality of sub pixels SP. For example, the pixel electrode is an anode electrode and the common electrode may be a cathode electrode. As another example, the pixel electrode is a cathode electrode and the common electrode may be an anode electrode. Further, for example, the light emitting diode 120 may be an electroluminescent diode OLED, a micro light emitting diode (Micro LED), or a quantum dot (QD) light emitting diode.

The driving transistor Td is a transistor for driving the light emitting diode 120 and may include a first node N1, a second node N2, a third node N3, and the like.

For example, the first node N1 of the driving transistor Td may be a gate node of the driving transistor Td and may be electrically connected to a source node or a drain node of the scan transistor Ts. Further, the second node N2 of the driving transistor Td may be a source node or a drain node of the driving transistor Td and may be electrically connected to the pixel electrode of the light emitting diode 120. The third node N3 of the driving transistor Td may be electrically connected to a driving voltage line DVL which supplies a driving voltage EVDD.

For example, the scan transistor Ts is controlled by a scan signal SCAN and may be connected between the first node N1 of the driving transistor Td and the data line DL. The scan transistor Ts is turned on or turned off in accordance with the scan signal SCAN supplied from the gate line GL to control connection between the data line DL and the first node N1 of the driving transistor Td.

Further, the scan transistor Ts is turned on by the scan signal SCAN having a turn-on level voltage to transmit a data voltage Vdata supplied from the data line DL to the first node N1 of the driving transistor Td.

The turn-on level voltage of the scan signal SCAN which turns on the scan transistor Ts may be a high-level voltage or a low level voltage. The turn-off level voltage of the scan signal SCAN which turns off the scan transistor Ts may be a low-level voltage or a high level voltage. For example, when the scan transistor Ts is a n-type transistor, the turn-on level voltage is a high-level voltage and the turn-off level voltage may be a low level voltage. As another example, when the scan transistor Ts is a p-type transistor, the turn-on level voltage is a low-level voltage and the turn-off level voltage may be a high level voltage.

For example, each of the driving transistor Td and the scan transistor Ts may be an n-type transistor or a p-type transistor.

Further, the storage capacitor Cst may be connected between the first node N1 and the second node N2 of the driving transistor Td. The storage capacitor Cst is charged with a quantity of charges corresponding to a voltage difference of both ends of the storage capacitor Cst and maintains a voltage difference of both ends during a predetermined frame time. Accordingly, during the predetermined frame time, a corresponding sub pixel SP may emit light.

The storage capacitor Cst may be an external capacitor which is intentionally designed at the outside of the driving transistor Td, rather than a parasitic capacitor which is an internal capacitor present between the gate node and the source node (or the drain node) of the driving transistor Td.

In the display device according to the exemplary embodiment of the present disclosure, a sub pixel SP further includes one or more transistors or may further include one or more capacitors.

Figure 5:
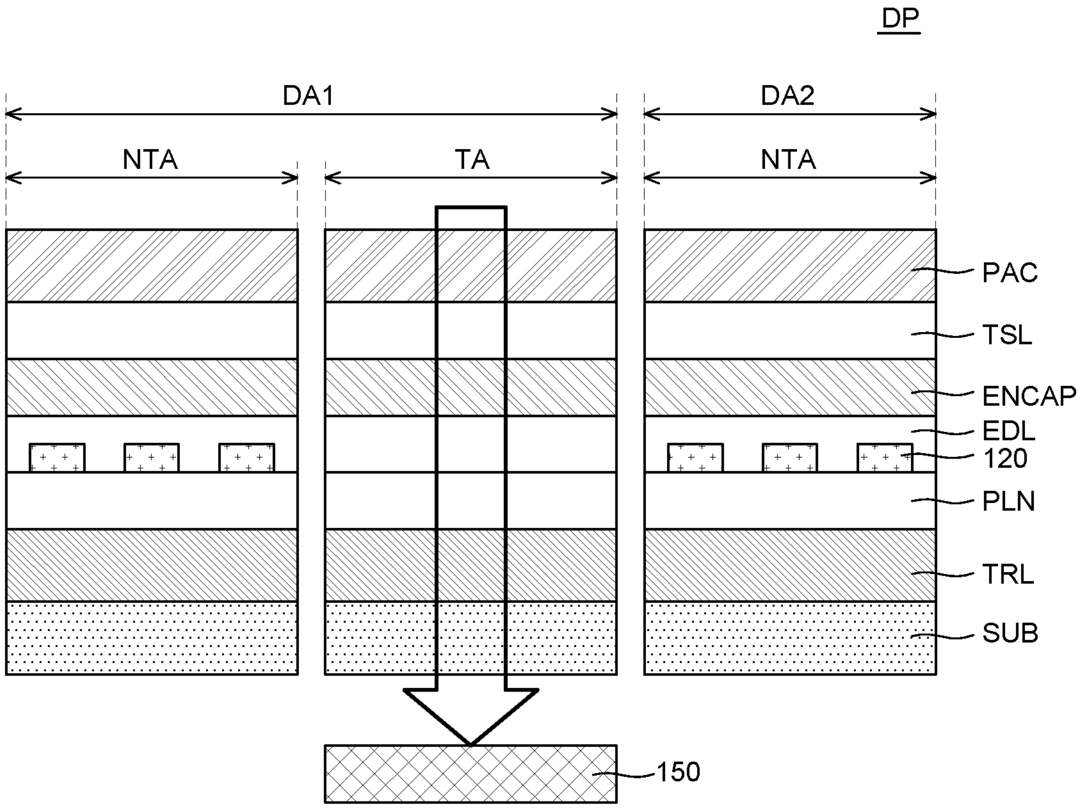
FIG. 5 is a view illustrating a cross-sectional structure of a non-transmission area and a transmission area in a first display area and a cross-sectional structure of a second display area, in a display device according to an exemplary embodiment of the present disclosure.

FIG. 5 is a view illustrating a cross-sectional structure of a non-transmission area and a transmission area in a first display area and a cross-sectional structure of a second display area, in a display device according to an exemplary embodiment of the present disclosure.

Referring to FIG. 5, the first display area DA1 of the display panel DP may include a transmission area TA and a non-transmission area NTA. The second display area DA2 of the display panel DP may be considered as a non-transmission area NTA.

Hereinafter, a lamination structure of the non-transmission area NTA and a lamination structure of the transmission area TA of the first display area DA1 and a lamination structure of the second display area DA2 will be described.

First, the lamination structure of the second display area DA2 is as follows.

In the second display area DA2, a transistor layer TRL is disposed above the substrate SUB and a planarization layer PLN may be disposed above the transistor layer TRL. Further, a light emitting diode layer EDL is disposed above the planarization layer PLN, and an encapsulation layer ENCAP may be disposed above the light emitting diode layer EDL.

Further, a touch sensor layer TSL is disposed above the encapsulation layer ENCAP and a passivation layer PAC may be disposed above the touch sensor layer TSL.

In the second display area DA2, on the transistor layer TRL, various transistors, such as a driving transistor and a scan transistor for each sub pixel may be disposed and further various insulating films for forming the transistors may be disposed. Various insulating films may include organic films and inorganic films.

In the second display area DA2, various wiring lines, such as a data line, a gate line, or a driving voltage line, may be disposed on the transistor layer TRL.

In the second display area DA2, a light emitting diode 120 for each sub pixel may be disposed on the light emitting diode layer EDL. For example, an anode electrode, a plurality of organic layers, and a cathode electrode which configure the light emitting diode 120 may be disposed on the light emitting diode layer EDL.

In the second display area DA2, on the touch sensor layer TSL, the touch sensor may be disposed and a touch buffer film and a touch insulating film required to form the touch sensor may be further disposed.

Next, the lamination structure of the non-transmission area NTA of the first display area DA1 is substantially the same as the lamination structure of the second display area DA2 excluding the SM structure.

Referring to FIG. 5, in the non-transmission area NTA of the first display area DA1, a transistor layer TRL is disposed above the substrate SUB and a planarization layer PLN is disposed above the transistor layer TRL. Further, a light emitting diode layer EDL is disposed above the planarization layer PLN, and an encapsulation layer ENCAP may be disposed above the light emitting diode layer EDL. Further, a touch sensor layer TSL is disposed above the encapsulation layer ENCAP and a passivation layer PAC may be disposed above the touch sensor layer TSL.

The light emitting diode 120 is vulnerable to moisture or oxygen. For example, the encapsulation layer ENCAP suppresses the permeation of moisture or oxygen to suppress the light emitting diode 120 from being exposed to the moisture or oxygen. The encapsulation layer ENCAP may be formed by one layer or a plurality of layers.

In the non-transmission area NTA of the first display area DA1, on the transistor layer TRL, various transistors, such as a driving transistor and a scan transistor for each sub pixel may be disposed and further various insulating films for forming the transistors may be disposed. Here, various insulating films may include organic films and inorganic films.

Further, in the non-transmission area NTA of the first display area DA1, various wiring lines, such as a data line, a gate line, or a driving voltage line, may be disposed on the transistor layer TRL.

In the non-transmission area NTA of the first display area DA1, on the light emitting diode layer 120, the emitting diode 120 of each sub pixel may be disposed. For example, an anode electrode, a plurality of organic layers, and a cathode electrode which configure the light emitting diode 120 may be disposed on the light emitting diode layer EDL. For example, in the non-transmission area NTA of the first display area DA1, the anode electrode may have a side mirror (SM) structure in which a side surface of the emission layer has a mirror shape. Further, a partition is added to the SM structure to have a double SM structure of a first SM structure and a second SM structure.

Further, in the non-transmission area NTA of the first display area DA1, the touch sensor TS may be disposed on the touch sensor layer TSL, and a touch buffer layer and a touch insulating film required to form the touch sensor TS may be further disposed.

Further, the lamination structure of the transmission area TA of the first display area DA1 is as follows.

Referring to FIG. 5, in the transmission area TA of the first display area DA1, a transistor layer TRL is disposed above the substrate SUB and a planarization layer PLN may be disposed above the transistor layer TRL. Further, a light emitting diode layer EDL is disposed above the planarization layer PLN and an encapsulation layer ENCAP may be disposed above the light emitting diode layer EDL. Further, a touch sensor layer TSL is disposed above the encapsulation layer ENCAP and a passivation layer PAC may be disposed above the touch sensor layer TSL.

For example, in the transmission area TA of the first display area DA1, a plurality of transistors and wiring lines are not disposed on the transistor layer TRL. However, in the transmission area TA of the first display area DA1, various insulating films required to form the transistor may be disposed on the transistor layer TRL. Here, various insulating films may include organic films and inorganic films.

In the transmission area TA of the first display area DA1, the light emitting diode 120 of each sub pixel is not disposed on the light emitting diode layer EDL. That is, the transmission area TA of the first display area DA1 lacks the light emitting diodes 120 to increase light transmittance in the transmission area TA of the first display area DA1. For example, in the transmission area TA of the first display area DA1, the anode electrode, the plurality of organic layers, and the cathode electrode are not disposed on the light emitting diode layer EDL. However, the present disclosure is not limited thereto and in the transmission area TA of the first display area DA1, only some of the anode electrode, the plurality of organic layers, and the cathode electrode may be disposed on the light emitting diode layer EDL. For example, in the transmission area TA of the first display area DA1, only the organic layer or only the anode electrode may extend to be disposed on the light emitting diode layer EDL.

In the transmission area TA of the first display area DA1, the touch sensor is not disposed on the touch sensor layer TSL. In the transmission area TA of the first display area DA1, the touch buffer film and the touch insulating film may be disposed on the touch sensor layer TSL.

Referring to FIG. 5, a metal material layer, between the metal material layer and an insulating material layer disposed in the non-transmission areas NTA of the first display area DA1 and the second area DA2 is not disposed in the transmission area TA of the first display area DA1. However, the insulating material layer, between the metal material layer and an insulating material layer disposed in the non-transmission areas NTA of the first display area DA1 and the second display area DA2 extends to the transmission area TA of the first display area DA1.

In other words, the metal material layer is disposed in the non-transmission area NTA of the first display area DA1 and the non-transmission area NTA of the second display area DA2, but is not disposed in the transmission area TA of the first display area DA1. The insulating material layer may be commonly disposed in the non-transmission area NTA of the first display area DA1, the non-transmission area NTA of the second display area DA2, and in the transmission area TA of the first display area DA1. However, the present disclosure is not limited thereto.

Further, the transmission area TA of the first display area DA1 may overlap the light receiving device 150 and external light may be transmitted to the light receiving device 150 through the transmission area TA of the first display area DA1. Accordingly, for the normal operation of the light receiving device 150, the transmittance of the transmission area TA of the first display area DA1 may need to be high.

Figure 6:
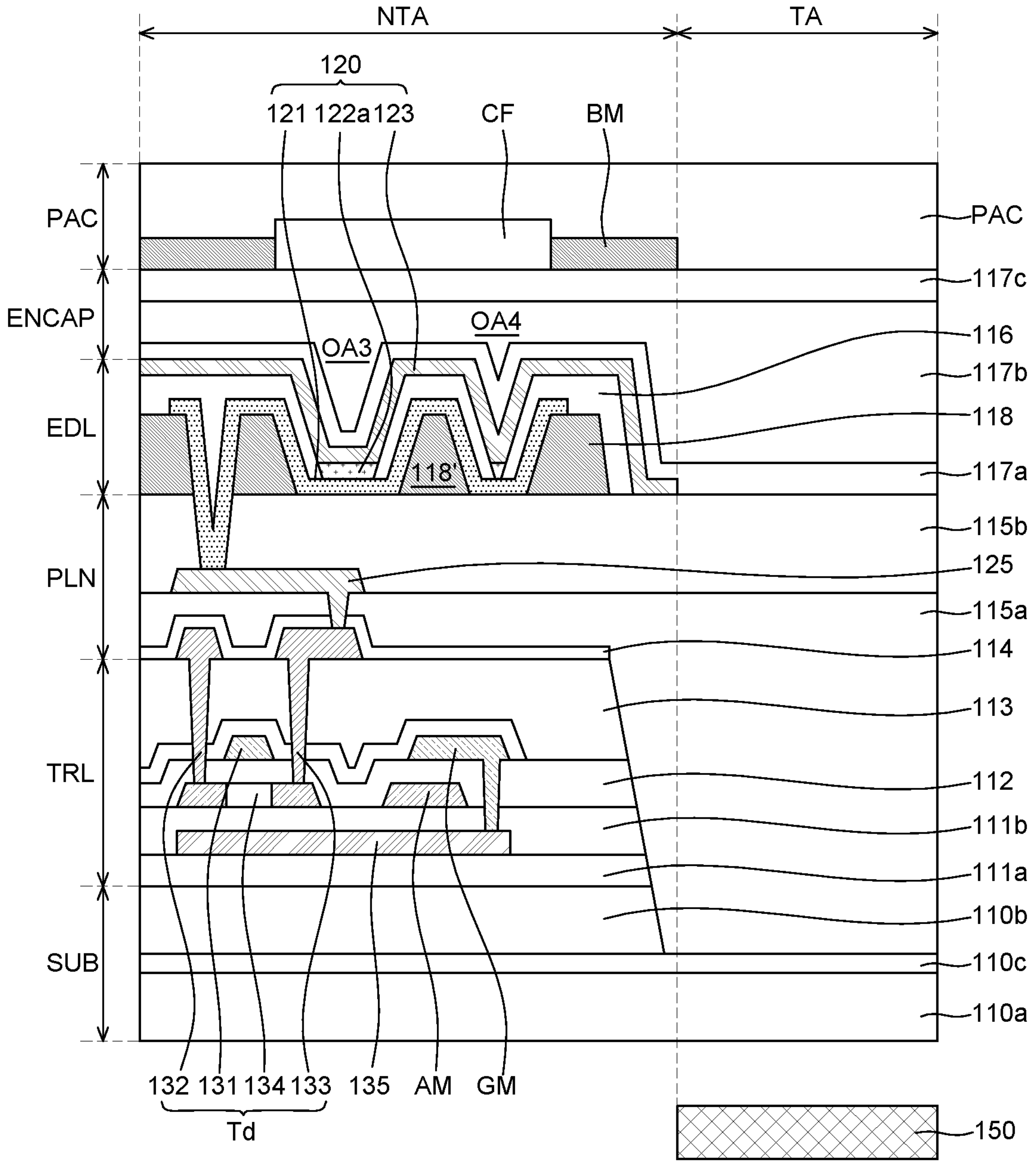
FIG. 6 is a view illustrating a part of a cross section of a display device according to an exemplary embodiment of the present disclosure.

FIG. 6 is a view illustrating a part of a cross section of a display device according to an exemplary embodiment of the present disclosure.

Figure 7A:
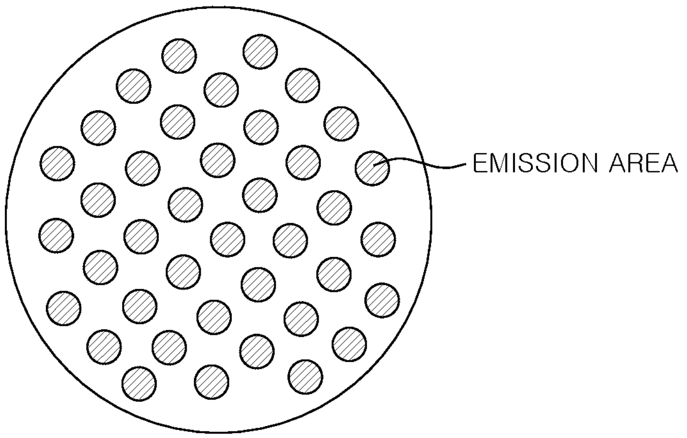
FIGS. 7A and 7B are views illustrating an emission area according to an exemplary embodiment of the present disclosure.
Figure 7B:
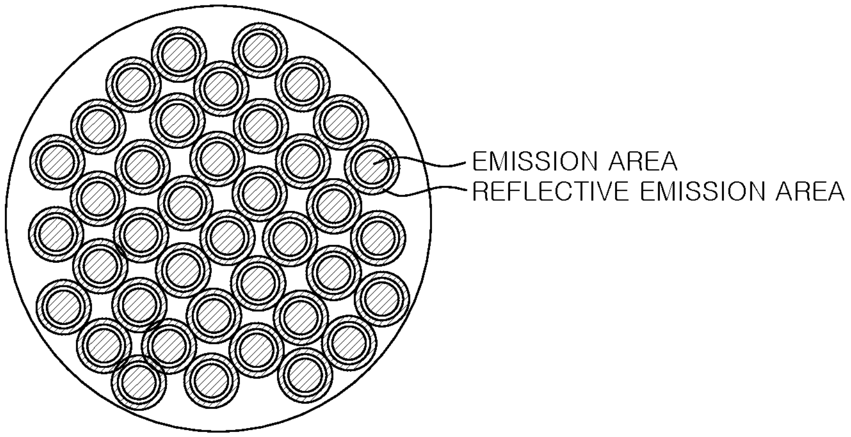

FIGS. 7A and 7B are views illustrating an emission area according to an exemplary embodiment of the present disclosure.

Figure 8:
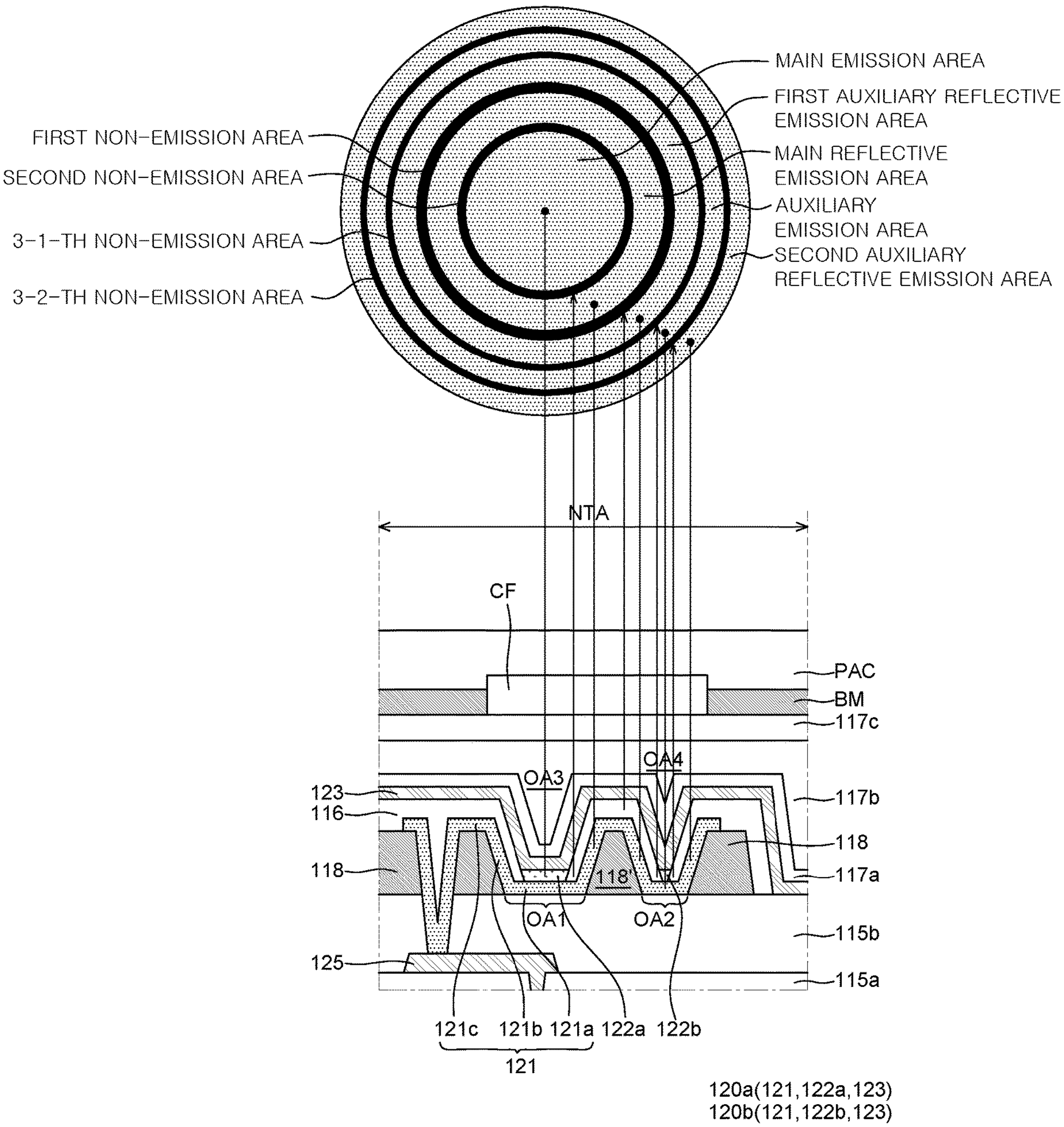
FIG. 8 is a view illustrating an emission area corresponding to a non-transmission area of a first display area according to an exemplary embodiment of the present disclosure.

FIG. 8 is a view illustrating an emission area corresponding to a non-transmission area of a first display area according to an exemplary embodiment of the present disclosure.

FIG. 6 illustrates a part of the cross-section of the non-transmission area NTA and the transmission area TA of the first display area.

In FIG. 6, for the convenience of description, the touch sensor layer is not illustrated, but the present disclosure is not limited thereto and may include a touch sensor layer.

FIG. 7A illustrates an emission area of Comparative Embodiment in which the SM structure of the present disclosure is not applied and FIG. 7B illustrates an example of an emission area of Embodiment in which the SM structure of the present disclosure is applied.

FIG. 8 illustrates a part of a non-transmission area NTA of a first display area illustrated in FIG. 6 and an emission area corresponding thereto.

Referring to FIGS. 6 and 7, a substrate SUB of the first display area may be divided into the non-emission area NTA and the transmission area TA. A transistor layer TRL, a planarization layer PLN, a light emitting diode layer EDL, an encapsulation layer ENCAP, and a passivation layer PAC may be disposed above the substrate SUB which is divided into the non-transmission area NTA and the transmission area TA.

In the transmission area TA, some configurations of the substrate SUB and the transistor layer TRL may not be disposed, but the present disclosure is not limited thereto.

First, the lamination structure of the non-transmission area NTA included in the first display area will be described.

The substrate SUB may include a first substrate 110*a*, a second substrate 110*b*, and an interlayer insulating film 110*c*. The interlayer insulating film 110*c* may be disposed between the first substrate 110*a* and the second substrate 110*b*. As described above, the substrate SUB is configured by the first substrate 110*a*, the second substrate 110*b*, and the interlayer insulating film 110*c* to suppress the moisture permeation. For example, the first substrate 110*a* and the second substrate 110*b* may be polyimide (PI) substrates.

On the transistor layer TRL, various patterns 131, 132, 133, and 134, various insulating films 111*a*, 111*b*, 112, 113, and 114, and various metal patterns TM, GM, and 135 for forming a transistor, such as a driving transistor Td, may be disposed.

Hereinafter, the lamination structure of the transistor layer TRL will be described in more detail.

A multi-buffer layer 111*a* is disposed on a second substrate 110*b* and an active buffer layer 111*b* may be disposed on the multi-buffer layer 111*a*.

A metal layer 135 may be disposed on the multi-buffer layer 111*a*.

The metal layer 135 may serve as a light shield and may be a light shielding layer.

An active buffer layer 111*b* may be disposed on the metal layer 135.

An active layer 134 of the driving transistor Td may be disposed on the active buffer layer 111*b*.

An active material layer AM may be disposed on the active buffer layer 111*b* in a position different from a forming position of the driving transistor Td. For example, the active material layer AM may be a first storage electrode, but is not limited thereto.

A gate insulating film 112 may be disposed on the active layer 134.

Further, a gate electrode 131 of the driving transistor Td may be disposed on the gate insulating film 112. At this time, a gate material layer GM may be disposed on the gate insulating film 112 in a position different from a forming position of the driving transistor Td. For example, the gate material layer GM may be a second storage electrode, but is not limited thereto. In this case, the gate material layer GM may configure the storage capacitor together with the active material layer AM and may be electrically connected to the metal layer 135 through a contact hole.

An interlayer insulating film 113 may be disposed on the gate electrode 131 and the gate material layer GM.

The source electrode 132 and the drain electrode 133 of the driving transistor Td may be disposed on the interlayer insulating film 113.

For example, the source electrode 132 and the drain electrode 133 may be electrically connected to one side and the other side of the active layer 134 through contact holes provided in the interlayer insulating film 113 and the gate insulating film 112.

A part of the active layer 134 which overlaps the gate electrode 131 is a channel region. One of the source electrode 132 and the drain electrode 133 is connected to one side of the channel region in the active layer 134 and the other one is connected to the other side of the channel region in the active layer 134.

The passivation film 114 may be disposed on the source electrode 132 and the drain electrode 133.

The planarization layer PLN may be located above the transistor layer TRL.

The planarization layer PLN may include a first planarization layer 115*a* and a second planarization layer 115*b*. The first planarization layer 115*a* is formed of a PI based material and the second planarization layer 115*b* may be formed of a PAC based material. That is, the pixel shrinkage issue in the UDC model or the UDIR model is mainly caused by the outgas of the second planarization layer 115*b* rather than the first planarization 115*a* so that only the second planarization layer 115*b* is configured by the PAC based material. However, it is not limited thereto.

The first planarization layer 115*a* may be disposed on the passivation film 114.

The connection electrode 125 may be disposed on the first planarization layer 115*a*.

For example, the connection electrode 125 may be electrically connected to one of the source electrode 132 and the drain electrode 133 through a contact hole provided in the first planarization layer 115*a*.

The second planarization layer 115*b* may be disposed on the connection electrode 125.

The light emitting diode layer EDL may be located above the second planarization layer 115*b*.

Hereinafter, a lamination structure of the light emitting diode layer EDL will be described in detail.

The anode electrode 121 may be disposed on the second planarization layer 115*b*. For example, the anode electrode 121 may be electrically connected to the connection electrode 125 there below through the contact hole provided in the second planarization layer 115*b*. The first bank 118 may be disposed on the second planarization layer 115*b*.

For example, the first bank 118 may be configured by acrylic-based resin or epoxy-based resin, and specifically, may be configured by photoacryl (PAC). The first bank 118 may be a third planarization layer or a PAC layer.

A part of the first bank 118 corresponding to an emission area of the sub pixel may be open.

For example, the first bank 118 may include a first open area OA1 obtained by removing (opening) a part corresponding to the main emission area of the first sub pixel and a second open area OA2 obtained by removing a part corresponding to an auxiliary emission area. The first open area OA1 may have a larger width than that of the second open area OA2. That is, a width of the first open area OA1 is wider than a width of the second open area OA2. For example, when viewed in a planar perspective, the first open area OA1 may have a circular shape and the second open area OA2 may have a ring (donut) shape which is partially cut out, but the present disclosure is not limited thereto. The second open area OA2 may have a complete ring shape.

The first bank 118 may include a top surface and a side portion.

A top surface of the first bank 118 is a surface located at the top of the first bank 118 and is substantially parallel to the substrate SUB.

A side portion of the first bank 118 may be a surface extending from the top surface of the first bank 118 to a side surface of the first bank 118. A side portion of the first bank 118 may have a predetermined taper angle. For example, a side portion of the first bank 118 may have a tapered angle of 30° to 65°, but is not limited thereto.

The anode electrode 121 may be disposed on the top surface and the side portion of the first bank 118 and on the second planarization layer 115*b*. For example, the anode electrode 121 may be disposed on the first open area OA1, the second open area OA2, and a top surface and a side portion of the first bank 118.

Further, for example, the anode electrode 121 which is disposed in the first open area OA1 and the second open area OA2 may be in contact with the second planarization layer 115*b*.

Further, for example, the anode electrode 121 may include a first area 121*a* (e.g., a first portion) which has a surface substantially parallel to a surface of the substrate SUB in the first open area OA1 and the second open area OA2 and a second area 121*b* which extends from the first area 121*a* so that a surface has a predetermined angle with respect to the substrate SUB. For example, the first area 121*a* of the anode electrode 121 may correspond to the first open area OA1 and the second open area OA2. That is, the first area 121*a* of the anode electrode 121*a* is in the first open area OA1 and the second open area OA2. The second area 121*b* (e.g., a second portion) of the anode electrode 121 may correspond to a side portion of the first bank 118. That is, the second area 121*b* of the anode electrode 121 is on the side portion of the first bank 118. The second area 121*b* of the anode electrode 121 is a part having a side mirror shape and may configure the SM structure. The SM structure of the anode electrode 121 may be configured in the first open area OA1 and the second open area OA2. The SM structure configured in the first open area OA1 is a first SM structure and the SM structure configured in the second open area OA2 may be a second SM structure. In other words, the first SM structure is referred to as a large SM structure and the second SM structure may be referred to as a small SM structure that is smaller than the large SM structure. For example, the first SM structure forms a main reflective emission area and the second SM structure may form an auxiliary reflective emission area.

The first bank 118 between the first open area OA1 and the second open area OA2 may configure a partition 118' which divides (separates) the first SM structure and the second SM structure. In the meantime, the non-emission area may be formed between the main reflective emission area and the auxiliary emission area by the partition 118'. For example, the non-emission area may be formed as much as a width of the partition 118'. The non-emission area at this time may be referred to as a first non-emission area.

For example, the first SM structure configured in the first open area OA1 forms the main reflective emission area. A part of light emitted by the first light emitting diode 120*a* is reflected from the second area 121*b* of the anode electrode 121 by the first SM structure to form a ring-shaped main reflective emission area. Accordingly, the luminous efficiency of the first display area may be improved.

Further, for example, the second SM structure configured in the second open area OA2 forms the auxiliary reflective emission area. A part of light emitted by the second light emitting diode 120*b* is reflected from the second area 121*b* of the anode electrode 121 by the second SM structure to form the auxiliary reflective emission area. The auxiliary reflective emission area may include a first auxiliary reflective emission area by the second SM structure at the left side and a second auxiliary reflective emission area by the second SM structure at a right side, but is not limited thereto. The auxiliary emission area and the auxiliary reflective emission area follow outlines of the main emission area or the main reflective emission area and may have a continuous ring shape or a discontinuous ring shape. In the case of the discontinuous shape, the auxiliary emission area and the auxiliary reflective emission area enclose the outline of the main emission area or the auxiliary reflective emission area with a discontinuous shape in the middle. The second SM structure is closer to a transmission unit than the first SM structure so that a distance from the transmission area TA is shorter than that of the main reflective emission area to increase a viewing angle in the transmission area TA in the first display area DA1.

As described above, in the present disclosure, a partition 118' is added in the SM structure to form a double SM structure with a first SM structure and a second SM structure to improve the luminous efficiency and the viewing angle.

In the meantime, referring to FIG. 7A, it is understood that in Comparative Embodiment in which the SM structure of the present disclosure is not applied, there is only one emission area. Referring to FIG. 7B, it is understood that in Embodiment in which the single SM structure of the present disclosure is applied, there is a reflective emission area by the SM structure around the emission area. Further, in Embodiment in which the double SM structure of the present disclosure is applied, referring to FIG. 8, it is understood that there are a main reflective emission area, an auxiliary emission area, and an auxiliary reflective emission area around the main emission area. Accordingly, in spite of the reduction in the pixels per inch, the luminous efficiency of the first display area may be improved.

Referring to FIGS. 6 and 8, the anode electrode 121 extends from the second area 121*b* to include a third area 121*c* having a surface substantially parallel to a surface of the substrate SUB. The third area 121*c* may correspond to a top surface of the first bank 118.

As described above, in one sub pixel, the second planarization layer 115*b* and the first bank 118 may include at least one contact hole spaced apart from the first open area OA1. Therefore, the driving transistor Td and the anode electrode 121 of the first and second emission diodes 120*a* and 120*b* may be electrically connected through a contact hole.

The second bank 116 may be disposed while covering the anode electrode 121.

The second bank 116 may cover the second area 121*b* and the third area 121*c* of the anode electrode 121.

A part of the second bank 116 corresponding to an emission area of the sub pixel may be open.

For example, the second bank 116 may include a third open area OA3 obtained by removing (opening) a part corresponding to the main emission area of the first sub pixel and a fourth open area OA4 obtained by removing a part corresponding to an auxiliary emission area. The third open area OA3 may have a larger width than that of the fourth open area OA4. That is, a width of the third open area OA3 is wider than a width of the fourth open area OA4. For example, when viewed in a planar perspective, the third open area OA3 may have a circular shape and the fourth open area OA4 may have a ring (donut) shape which is partially cut out, but the present disclosure is not limited thereto. The fourth open area OA4 may have a complete ring shape.

The second bank 116 may be include a top surface, a side portion, and a bottom surface.

A top surface of the second bank 116 is a surface located at the top of the second bank 116 and may be substantially parallel to the substrate SUB. Further, the top surface of the second bank 116 may correspond to (e.g., overlap) the top surface of the first bank 118.

A side portion of the second bank 116 may be a surface extending from the top surface of the second bank 116 to a side surface of the second bank 116. A side portion of the second bank 116 may have a predetermined taper angle. For example, a side portion of the second bank 116 may have a taper angle of 30° to 65°, but is not limited thereto. The side portion of the second bank 116 may correspond to (e.g., overlap) the side portion of the first bank 118.

A bottom surface of the second bank 116 may correspond to a surface of the first area 121*a* of the anode electrode 121 which abuts with the anode electrode 121. A width of the bottom surface of the second bank 116 is equal to a width in the first open area OA1 and a width in the second open area OA2. Even though it is not illustrated, as another exemplary embodiment, a width of the bottom surface of the second bank 116 may be different from a width in the first open area OA1 and a width in the second open area OA2. For example, a width of the bottom surface of the second bank 116 in the second open area OA2 may be smaller than in the first open area OA1.

In addition, the bottom surface of the second bank 116 corresponds to the second non-emission area between the main emission area and the main reflective emission area or corresponds to the third non-emission area between the auxiliary emission area and the auxiliary reflective emission area. The third non-emission area may include a 3-1-th non-emission area by the bottom surface of the second bank 116 at the left side of the second open area OA2 and a 3-2-th non-emission area by the bottom surface of the second bank 116 at the right side of the second open area OA2, but is not limited thereto. However, a width of the second open area OA2, that is, a width of the bottom surface of the second bank 116 is designed to be different from that in the first open area OA so that the waveguide in each sub pixel may vary. Therefore, there may be at least one auxiliary reflective emission area and at least one non-emission area, for example, a second non-emission area or a third non-emission area, in addition to the auxiliary emission area.

Therefore, a sub pixel in the first display area DA1 may have a plurality of emission areas and a plurality of non-emission areas. A width of the emission area of each sub pixel may have a relationship of "main emission area>main reflective emission area>auxiliary emission area, auxiliary reflective emission area." A width of the non-emission area of each sub pixel may have a relationship of "first non-emission area>second non-emission area>third non-emission area," but, it is not limited thereto.

The second open area OA2 has a width smaller than the first open area OA1 and a tapered angle of the side portion of the first bank 118 is larger. A width of a bottom surface of the second bank 116 may be different in each of open areas OA1 and OA2 for reasons of a process efficiency for stably laminating the light emitting diode 120.

The first open area OA1 and the second open area OA2 provided in the first bank 118 may have a width larger than that of the third open area OA3 and the fourth open area OA4 provided in the second bank 116. Therefore, the third open area OA3 and the fourth open area OA4 may be located in the first open area OA1 and the second open area OA2.

For example, a part of the anode electrode 121 may be exposed by the third open area OA3 and the fourth open area OA4. The second bank 116 may be formed of a PI based material, but is not limited thereto.

For example, the first organic layer 122*a* and the second organic layer 122*b* may be disposed in the third open area OA3 and the fourth open area OA4 of the second bank 116 and in the vicinity of the third open area OA3 and the fourth open area OA4. Therefore, each of the first organic layer 122*a* and the second organic layer 122*b* may be disposed on the anode electrode 121 exposed through the third open area OA3 and the fourth open area OA4 of the second bank 116. For example, the first organic layer 122*a* is disposed in the third open area OA3 of the second bank 116 and the second organic layer 122*b* may be disposed in the fourth open area OA4 of the second bank 116.

The first organic layer 122*a* and the second organic layer 122*b* may be disposed in the third open area OA3 and the fourth open area OA4, but is not limited thereto. Some of them may be disposed also on the top surface and the side portion of the second bank 116 as well as the third open area OA3 and the fourth open area OA4.

The cathode electrode 123 may be disposed on the first organic layer 122*a* and the second organic layer 122*b*.

The first light emitting diode 120*a* may be configured by the anode electrode 121, the first organic layer 122*a*, and the cathode electrode 123, and the second light emitting diode 120*b* may be configured by the anode electrode 121, the second organic layer 122*b*, and the cathode electrode 123.

For example, the main emission area may be formed by the first light emitting diode 120*a* provided in the third open area OA3. Further, for example, the auxiliary emission area may be formed by the second light emitting diode 120*b* provided in the fourth open area OA4.

As described above, the main emission area and the auxiliary emission area may be divided by the partition 118'.

The encapsulation layer ENCAP may be located above the above-described light emitting diode layer EDL.

The encapsulation layer ENCAP may have a single layer structure or a multi-layered structure. For example, the encapsulation layers ENCAP may include a first encapsulation layer 117*a*, a second encapsulation layer 117*b*, and a third encapsulation layer 117*c*.

For example, the first encapsulation layer 117*a* and the third encapsulation layer 117*c* are configured by inorganic films and the second encapsulation layer 117*b* may be configured by an organic film. For example, among the first encapsulation layer 117*a*, the second encapsulation layer 117*b*, and the third encapsulation layer 117*c*, the second encapsulation layer 117*b* is the thickest and serves as a planarization layer.

The first encapsulation layer 117*a* is disposed above the cathode electrode 123 and may be disposed to be most adjacent to the first and second light emitting diodes 120*a* and 120*b*.

The first encapsulation layer 117*a* may be formed by the inorganic insulating material which may be subjected to the low temperature deposition, and for example, may be configured by silicon nitride SiNx, silicon oxide SiOx, silicon oxynitride SiON, or aluminum oxide $Al_2O_3$. The first encapsulation layer 117*a* is deposited under a low temperature atmosphere so that during the deposition process, the damage of the first and second organic layers 122*a* and 122*b* including an organic material which is vulnerable to the high temperature atmosphere may be suppressed.

The second encapsulation layer 117*b* may be formed to have a smaller area than that of the first encapsulation layer 117*a*. In this case, the second encapsulation layer 117*b* may be formed to expose both ends of the first encapsulation layer 117*a*. The second encapsulation layer 117*b* may serve to enhance a foreign material covering and planarizing performance. For example, the second encapsulation layer 117*b* may be formed of an organic insulating material, such as acrylic resin, epoxy resin, polyimide, polyethylene, or silicon oxy carbon (SiOC). For example, the second encapsulation layer 117*b* may be formed by an inkjet method, but is not limited thereto.

Even though it is not illustrated, in order to suppress the collapse of the encapsulation layer ENCAP, one or more dams may be disposed at an end portion of the inclined surface of the encapsulation layer ENCAP or in the vicinity thereof. One or more dams may be disposed in a boundary between the display area and the non-display area or in the vicinity of the boundary.

For example, the second encapsulation layer 117*b* including an organic material may be located only on an inner side surface of an innermost primary dam. In this case, the second encapsulation layer 117*b* may not be disposed on an upper portion of all the dams. In contrast, the second encapsulation layer 117*b* including an organic material may be disposed in the upper portion of at least the primary dam, between the primary dam and a secondary dam. For example, the second encapsulation layer 117*b* may be located to extend to the upper portion of the primary dam. Alternatively, for example, the second encapsulation layer 117*b* may be located to extend to the upper portion of the secondary dam by passing the upper portion of the primary dam.

The third encapsulation layer 117*c* may be formed above the substrate SUB on which the second encapsulation layer 117*b* is formed so as to cover upper surfaces and side surfaces of the second encapsulation layer 117*b* and the first encapsulation layer 117*a*.

For example, the third encapsulation layer 117*c* may minimize or block the permeation of external moisture of oxygen into the second encapsulation layer 117*b* and the first encapsulation layer 117*a*. For example, the third encapsulation layer 117*c* may be configured by an inorganic insulating material, such as silicon nitride SiNx, silicon oxide SiOx, silicon oxynitride SiON, or aluminum oxide $Al_2O_3$.

Even though it is not illustrated, the touch sensor layer may be disposed above the above-described encapsulation layer ENCAP.

A black matrix BM and a color filter CF may be disposed above the encapsulation layer ENCAP. For example, a touch sensor layer, such as a touch electrode or a bridge electrode may be disposed between the encapsulation layer ENCAP and the black matrix BM.

The black matrix BM may be disposed in the non-transmission area NTA of the first display area excluding an emission area including a main emission area or an auxiliary reflective emission area.

In contrast, the color filter CF may be disposed so as to correspond to the emission area including the main emission area or the auxiliary reflective emission area. When the first and second light emitting diodes 120*a* and 120*b* emit white light, color filters CF for implementing red, green, and blue are necessary. However, when the first and second light emitting diodes 120*a* and 120*b* implement red, green, and blue by themselves, the color filter CF is not necessary.

For example, the passivation layer PAC may be disposed so as to cover the black matrix BM and the color filter CF. The passivation layer PAC may be configured by the organic insulating film of photo acryl (PAC).

Hereinafter, the lamination structure of the transmission area TA included in the first display area will be described.

Referring to FIG. 6, a part of the substrate SUB and various insulating films 115*a*, 115*b*, 117*a*, 117*b*, 117*c*, and PAC disposed in the non-transmission area NTA of the first display area may also be disposed in the transmission area TA of the first display area in the same way.

For example, the first substrate 110*a*, the interlayer insulating film 110*c*, the first planarization layer 115*a*, the second planarization layer 115*b*, the first encapsulation layer 117*a*, the second encapsulation layer 117*b*, the third encapsulation layer 117*c*, and the passivation layer PAC which are disposed in the non-transmission area NTA of the first display area may also be disposed in the transmission area TA of the first display area in the same way.

However, in the non-transmission area NTA of the first display area, a material layer (for example, a metal material layer or a semiconductor layer) having an electric characteristic or an opaque characteristic may not be disposed in the transmission area TA of the first display area, other than the insulating material.

For example, a metal material layer 135, 131, AM, GM, 132, 133, and 125 related to the transistor and the semiconductor layer 134 may not be disposed in the transmission area TA. Further, the first and second light emitting diodes 120*a* and 120*b* may not be disposed in the transmission area TA. Further, a touch sensor metal and a bridge metal which are included in the touch sensor layer may not be disposed in the transmission area TA, However, the present disclosure is not limited thereto.

Figure 9:
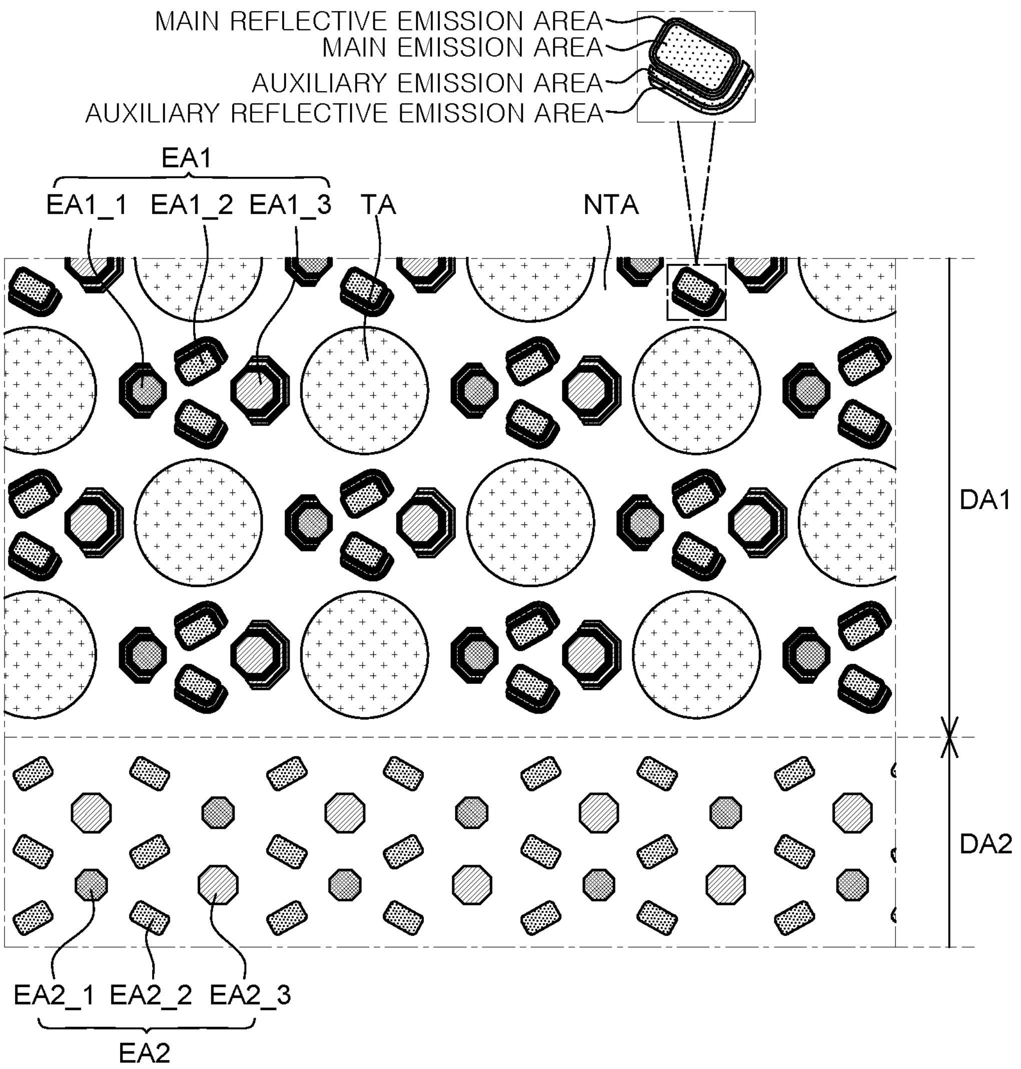
FIG. 9 is a view illustrating an emission area in a part A of FIG. 1 according to an exemplary embodiment of the present disclosure.

FIG. 9 is a view illustrating an emission area in a part A of FIG. 1 according to one embodiment.

Emission areas EA1 and EA2 illustrated in FIG. 9 may substantially correspond to sub pixels SP1_1, SP1_2, SP1_3: SP2_1, SP2_2, and SP2_3 of FIG. 3 except for the main reflective emission area, the auxiliary emission area, and the auxiliary reflective emission area.

Referring to FIG. 9, the display area may include a first display area DA1 overlapping the light receiving device and a second display area DA2 which is the remaining area.

The first display area DA1 may overlap the light receiving device.

The first display area DA1 may include a non-transmission area NTA and a transmission area TA.

The transmission area TA is a partial area which is included in the first display area DA1 and as an opaque configuration, such as the cathode electrode, is removed, external light may be transmitted to the light receiving device. For example, the transmission area TA may have a circular or oval shape, and may also be referred to as a hole area.

The non-transmission area NTA is the other partial area included in the first display area DA1 and a transistor of the transistor layer and a light emitting diode of the light emitting diode layer may be disposed in the non-transmission area.

The non-transmission area NTA may include a pixel area in which a plurality of sub pixels is present and a wiring area in which various signal lines are disposed.

When the transmission area TA is enclosed by the non-transmission area NTA, the first display area DA1 may include a plurality of separated transmission areas TA, but is not limited thereto.

In the pixel area of the first display area DA1, a plurality of first sub pixels may be disposed. Each of the plurality of first sub pixels may have a first emission area EA1.

For example, the first emission area EA1 may include a first-first emission area EA1_1, a first-second emission area EA1_2, and a first-third emission area EA1_3.

In the pixel area of the second display area DA2, a plurality of second sub pixels may be disposed. Each of the plurality of second sub pixels may have a second emission area EA2.

For example, the second emission area EA2 may include a second-first emission area EA2_1, a second-second emission area EA2_2, and a second-third emission area EA2_3.

For example, the first-first emission area EA1_1 and the second-first emission area EA2_1 may be red emission areas.

For example, the first-second emission area EA1_2 and the second-second emission area EA2_2 may be green emission areas.

For example, the first-third emission area EA1_3 and the second-third emission area EA2_3 may be blue emission areas.

In FIG. 9, it is illustrated that one first-first emission area EA1_1, two first-second emission areas EA1_2, and one first-third emission area EA1_3 are gathered to configure one first emission area EA1, as an example. Further, one second-first emission area EA2_1, two second-second emission areas EA2_2, and one second-third emission area EA2_3 are gathered to configure one second emission area EA2. However, the present disclosure is not limited thereto.

Further, each of the first-second emission area EA1_2 disposed in the first display area DA1 and the second emission area EA2 disposed in the second display area DA2 have a rhombus shape, but are not limited thereto.

Further, the first-second emission area EA1_2 disposed in the first display area DA1 may be disposed to be enclosed by four transmission areas TA, but is not limited thereto.

As seen from FIG. 3 above-described, it is understood that the first pixel disposed in the first display area DA1 has the pixels per inch (PPI) that is less than the second pixel disposed in the second display area DA2 so that the transmittance of the first display area DA1 which overlaps the light receiving device may be improved. However, by doing this, the efficiency deviation between the first display area DA1 and the second display area DA2 is caused.

Therefore, in the present disclosure, the SM structure is applied to the first sub pixel in the first display area DA1 to form a main reflective emission area around the main emission area. By doing this, the luminance efficiency is improved to improve the degradation of the sharpness and the color sense and the transmission area TA in which the light receiving device receives light is additionally ensured to improve an image quality of the light receiving device.

Further, in the present disclosure, a partition is added in the SM structure to form a double SM structure with a first SM structure and a second SM structure to form the auxiliary emission area and the auxiliary reflective emission area around the main emission area. Therefore, the efficiency deviation and the visibility difference between the first display area DA1 and the second display area DA2, and a visibility difference in the transmission area TA and the non-transmission area NTA in the first display area DA1 are reduced and the luminous efficiency and the viewing angle may be improved.

As described above, in the second display area DA2, each of the second-first emission area EA2_1, the second-second emission area EA2_2, and the second-third emission area EA2_3 may correspond to the second sub pixel. However, in the first display area DA1, the main reflective emission area, the auxiliary emission area, and the auxiliary reflective emission area are added by the double SM structure in addition to the main emission area. Therefore, each of the first-first emission area EA1_1, the first-second emission area EA1_2, and the first-third emission area EA1_3 may be expanded as compared with each of the first sub pixel. For example, the first-first emission area EA1_1, the first-second emission area EA1_2, and the first-third emission area EA1_3 may include the main reflective emission area, the auxiliary emission area, and the auxiliary reflective emission area around the main emission area.

In the meantime, for example, the main emission area and the main reflective emission area may be formed in each of the first sub pixels, for example, each of the first-first sub pixel, the first-second sub pixel, and the first-third sub pixel. For example, the auxiliary emission area and the auxiliary reflective emission area are not formed in a portion of the first sub pixel in which the first-first sub pixel, the first-second sub pixel, and the first-third sub pixel are opposite to each other, but may be formed at the outside of the first sub pixel which is opposite to (e.g., faces) the transmission area TA. However, it is not limited thereto. Accordingly, the main emission area and the main reflective emission area may have a circular or an oval shape and a complete ring shape, but the auxiliary emission area and the auxiliary reflective emission area may have a ring shape which is partially cut out. In this case, for example, the first SM structure may be formed in each of the first-first sub pixel, the first-second sub pixel, and the first-third sub pixel. In contrast, the second SM structure may not be formed in the first pixel in which the first-first sub pixel, the first-second sub pixel, and the first-third sub pixel are opposite to each other, that is, in the first-first sub pixel, the first-second sub pixel, and the first-third sub pixel. The second SM structure may be formed only at the outside of the first pixel which is opposite to the transmission area TA, that is, at the outside of the first-first sub pixel, the first-second sub pixel, and the first-third sub pixel.

In the first display area DA1, a ring shaped main reflective emission area is present around the main emission area so that the luminous efficiency of the first display area DA1 may be improved more than the related art. Therefore, an image quality difference between the first display area DA1 and the second display area DA2 may be improved while maintaining the transmission area for the function of the light receiving device of the related art.

In the meantime, in the SM structure, the smaller the size of the sub pixel, the smaller the interval between the emission area and a side taper of the anode electrode to increase the light extraction effect and the light viewing angle effect. This is an effect according to the increase of the reflectance by the side mirror of the anode electrode. As described in the present disclosure, when the sub pixel is designed to be smaller to be close to the transmission area TA, for example, when a second light emitting diode having a small size is disposed to be close to the transmission area TA, the SM effect may be formed in the vicinity of the transmission area TA to be stronger. Accordingly, the efficiency deviation by the transmission area TA which is the non-emission area of the related art may be reduced.

The higher the pixels per inch (PPI), the higher the increase rate of the luminance viewing angle. For example, in 150 PPI, red, green, and blue luminance viewing angles are increased by 4.0%, 14.8%, and 21.9%, respectively and in 250 PPI, red, green, and blue luminance viewing angles are increased by 7.0%, 13.8%, and 18.1%, respectively. Further, for example, in 350 PPI, red, green, and blue luminance viewing angles are increased by 15.7%, 23.8%, and 29.7%, respectively and in 450 PPI, red, green, and blue luminance viewing angles are increased by 25.5%, 29.7%, and 40.0%, respectively.

Further, when the side taper of the anode electrode is increased in the vicinity of the transmission area TA, the luminance viewing angle may be further significantly increased so that the image quality difference between the first display area DA1 and the second display area DA2 may be reduced even during the tilting. For example, at the red luminance viewing angle, when the side taper angle of the anode electrode is 30°, the increase rates of the luminance viewing angle of 150 PPI, 250 PPI, 350 PPI, and 450 PPI are approximately −1%, 0%, 0%, and −6%. At the side taper angle of 45°, the increase rates of the luminance viewing angle of 150 PPI, 250 PPI, 350 PPI, and 450 PPI are approximately 0%, 0%, 1%, and −2%. At the side taper angle of 60°, the increase rates of the luminance viewing angle of 150 PPI, 250 PPI, 350 PPI, and 450 PPI are approximately 4%, 6%, 15%, and 26%. The high increase rates of the luminance viewing angle is shown at a high angle. For example, at the green luminance viewing angle, when the side taper angle of the anode electrode is 30°, the increase rates of the luminance viewing angle of 150 PPI, 250 PPI, 350 PPI, and 450 PPI are approximately 2%, 0%, 2%, and 0%. At the side taper angle of 45°, the increase rates of the luminance viewing angle of 150 PPI, 250 PPI, 350 PPI, and 450 PPI are approximately 7%, 6%, 6%, and 8%. At the side taper angle of 60°, the increase rates of the luminance viewing angle of 150 PPI, 250 PPI, 350 PPI, and 450 PPI are approximately 15%, 14%, 24%, and 30%. The high increase rates of the luminance viewing angle is shown at a high angle. For example, at the blue luminance viewing angle, when the side taper angle of the anode electrode is 30°, the increase rates of the luminance viewing angle of 150 PPI, 250 PPI, 350 PPI, and 450 PPI are approximately 1%, 0%, 1%, and 9%. At the side taper angle of 45°, the increase rates of the luminance viewing angle of 150 PPI, 250 PPI, 350 PPI, and 450 PPI are approximately 6%, 6%, 10%, and 24%. At the side taper angle of 60°, the increase rates of the luminance viewing angle of 150 PPI, 250 PPI, 350 PPI, and 450 PPI are approximately 23%, 18%, 30%, and 40%. The high increase rates of the luminance viewing angle is shown at a high angle.

For example, when a ratio of a height of the side mirror of the anode electrode with respect to the width of the light emitting diode is increased, the SM performance is improved to increase the light extraction efficiency.

In the meantime, for example, when a size ratio of the second SM structure and the first SM structure is 1:3, the luminance viewing angle of the second SM structure may be at least twice as high as that of the first SM structure. In particular, since a high luminance viewing angle rises at a high angle, the difference in image quality between the first display area DA1 and the second display area DA2 felt by the user during tilting may be effectively improved.

In the meantime, the present disclosure is not limited to the shape or the structure of the sub pixel (or the emission area) described above, but may be applied to various shapes or structure, which will be described in detail with reference to the following drawing.

Figure 10:
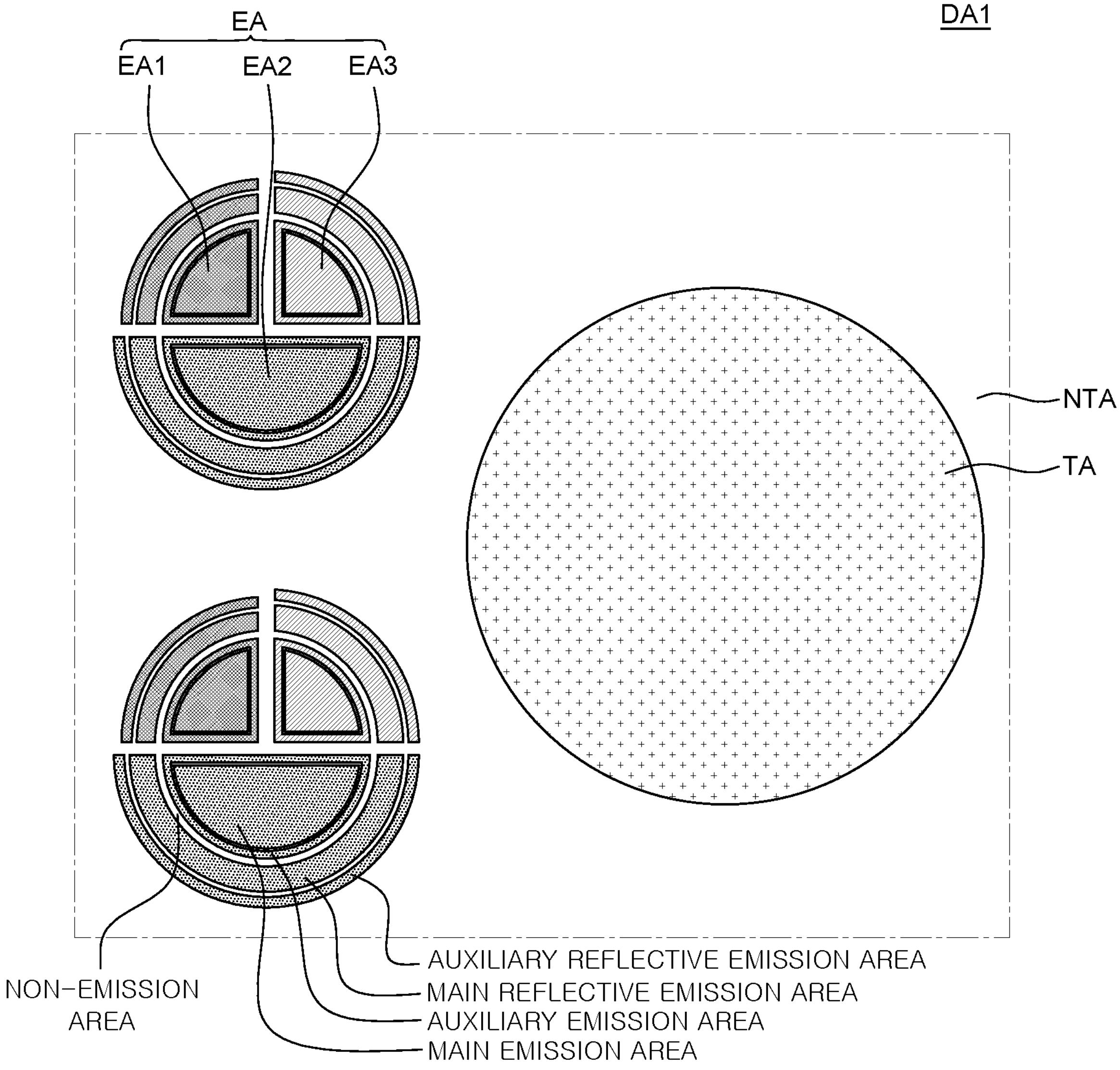
FIG. 10 is a view illustrating an emission area of another exemplary embodiment of the present disclosure.

FIG. 10 is a view illustrating an emission area of another exemplary embodiment of the present disclosure.

A display device according to another exemplary embodiment of the present disclosure of FIG. 10 has the substantially same configurations as the display device according to one exemplary embodiment of the present disclosure of FIGS. 1 to 9 excluding the shape of the emission area EA. Therefore, a redundant description will be omitted.

FIG. 10 illustrates a part of the first display area DA1.

Referring to FIG. 10, the display area includes a first display area DA1 overlapping the light receiving device and a second display area which is the remaining area.

The first display area DA1 may overlap the light receiving device.

The first display area DA1 may include a non-transmission area NTA and a transmission area TA.

The non-transmission area NTA is the other partial area included in the first display area DA1 and a transistor of the transistor layer and a light emitting diode of the light emitting diode layer may be located in the non-transmission area. For example, the transmission area TA may have a circular or oval shape.

The non-transmission area NTA may include a pixel area in which a plurality of sub pixels is present and a wiring area in which various signal lines are disposed.

In the pixel area of the first display area DA1, a plurality of sub pixels may be disposed. Each of the plurality of sub pixels may have an emission area EA.

For example, the emission area EA may include a first emission area EA1, a second emission area EA2, and a third emission area EA3.

For example, the first emission area EA1 may be a red emission area.

For example, the second emission area EA2 may be a green emission area.

For example, the third emission area EA3 may be a blue emission area.

Even though in FIG. 10, an example that one first emission area EA1, one second emission area EA2, and one third emission area EA3 are gathered to configure one emission area EA is illustrated, it is not limited thereto.

For example, the first emission area EA1 and the third emission area EA3 are disposed to be opposite to each other to have a semicircular shape and the second emission area EA2 is opposite to the first emission area EA1 and the third emission area EA3 to have another semicircular shape, but is not limited thereto.

The first emission area EA1 and the third emission area EA3 may be configured so as to be opposite to the second emission area EA2, but are not limited thereto.

The first emission area EA1 and the third emission area EA3 may have an area smaller than that of the second emission area EA2, but are not limited thereto.

As described above, in the present disclosure, the SM structure is applied to the first sub pixel in the first display area DA1 to form a main reflective emission area around the main emission area.

Further, in the present disclosure, a partition is added in the SM structure to form a double SM structure with a first SM structure and a second SM structure to form the auxiliary emission area and the auxiliary reflective emission area around the main emission area.

For example, the main emission area and the main reflective emission area may be included in each of the first emission area EA1, the second emission area EA2, and the third emission area EA3. Further, for example, the auxiliary emission area and the auxiliary reflective emission area are not disposed in the emission area EA in which the first emission area EA1, the second emission area EA2, and the third emission area EA3 are opposite to each other, but may be formed at the outside of the emission area EA which is opposite to the transmission area TA. However, it is not limited thereto.

Figure 11:
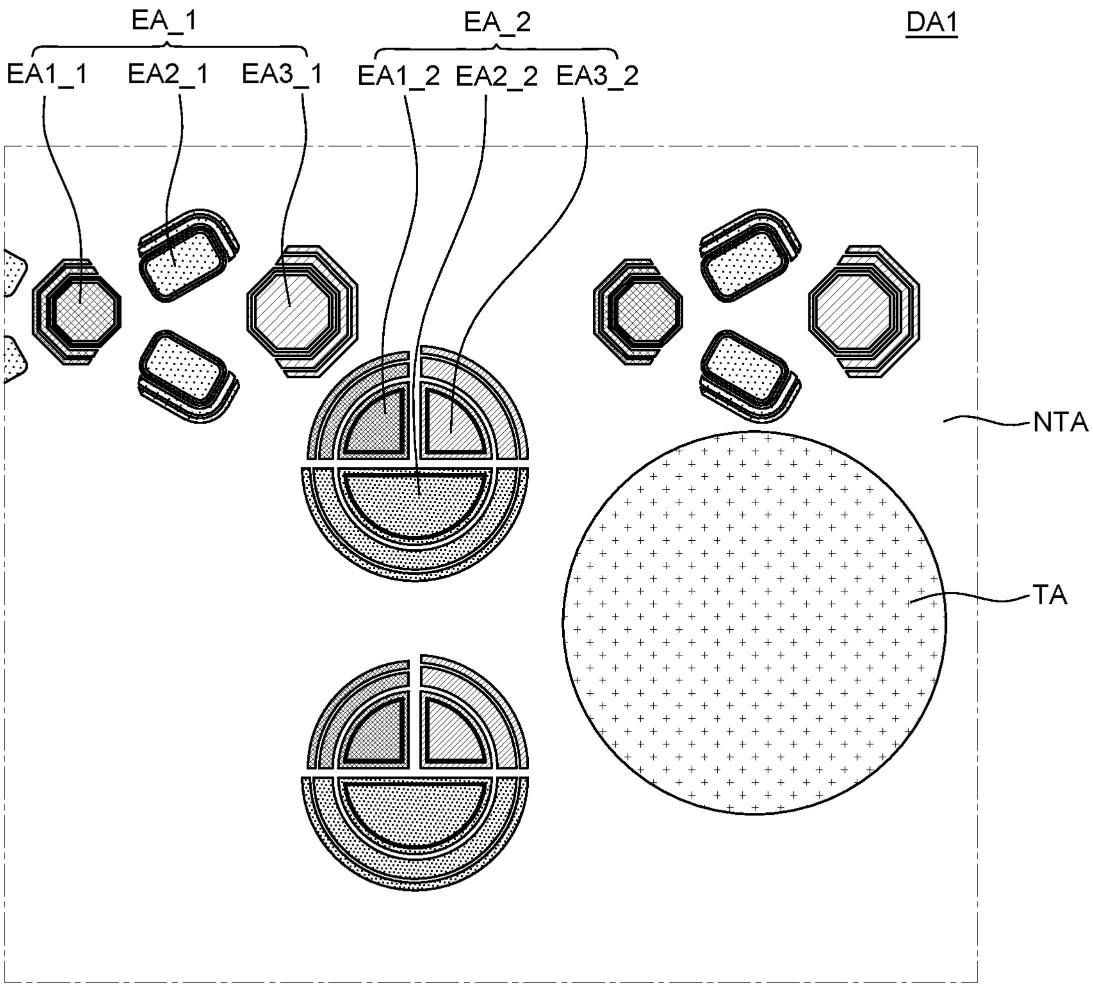
FIG. 11 is a view illustrating an emission area according to still another exemplary embodiment of the present disclosure.

FIG. 11 is a view illustrating an emission area according to still another exemplary embodiment of the present disclosure.

A display device according to still another exemplary embodiment of the present disclosure of FIG. 11 has the substantially same configurations as the display device according to one exemplary embodiment of the present disclosure of FIGS. 1 to 9 excluding the shape of the emission areas EA_1 and EA_2. Therefore, a redundant description will be omitted.

FIG. 11 illustrates a part of the first display area DA1.

Referring to FIG. 11, the display area includes a first display area DA1 overlapping the light receiving device and a second display area which is the remaining area.

The first display area DA1 may overlap the light receiving device.

The first display area DA1 may include a non-transmission area NTA and a transmission area TA.

Further, the non-transmission area NTA is the other partial area included in the first display area DA1 and a transistor of the transistor layer and a light emitting diode of the light emitting diode layer may be located in the non-transmission area. For example, the transmission area TA may have a circular or oval shape.

The non-transmission area NTA may include a pixel area in which a plurality of sub pixels is present and a wiring area in which various signal lines are disposed.

In the pixel area of the first display area DA1, a plurality of sub pixels may be disposed. Each of the plurality of sub pixels may have emission areas EA_1 and EA_2.

According to still another exemplary embodiment of the present disclosure of FIG. 11, two types of sub pixels may be mixed. For example, a first type of sub pixel may correspond to a first sub pixel of FIG. 9 and a second type of sub pixel may correspond to a sub pixel of FIG. 10.

Therefore, for example, in the emission areas EA_1 and EA_2, a first type of emission area EA_1 corresponding to the first type of sub pixel and a second type of emission area EA_2 corresponding to the second type of sub pixel may be mixed.

The first type of emission area EA_1 may include a first type of first emission area EA1_1, a first type of second emission area EA2_1, and a first type of third emission area EA3_1.

The second type of emission area EA_2 may include a second type of first emission area EA1_2, a second type of second emission area EA2_2, and a second type of third emission area EA3_2.

For example, the first type of first emission area EA1_1 and the second type of first emission area EA1_2 may be red emission areas.

For example, the first type of second emission area EA2_1 and the second type of second emission area EA2_2 may be green emission areas.

For example, the first type of third emission area EA3_1 and the second type of third emission area EA3_2 may be blue emission areas.

In FIG. 11, one first type of first emission area EA1_1, two first types of second emission areas EA2_1, and one first type of third emission area EA3_1 are gathered to configure one first type of emission area EA_1. Further, one second type of first emission area EA1_2, one second types of second emission areas EA2_2, and one second type of third emission area EA3_2 are gathered to configure one second type of emission area EA_2. However, the present disclosure is not limited thereto.

As described above, in the present disclosure, the SM structure is applied to the first type of sub pixel and the second type of sub pixel of the first display area DA1 to form a main reflective emission area around the main emission area.

Further, in the present disclosure, a partition is added in each SM structure to form a double SM structure with a first SM structure and a second SM structure to form the auxiliary emission area and the auxiliary reflective emission area around the main emission area.

For example, the main emission area and the main reflective emission area may be included in each of the first type of first emission area EA1_1, the first type of second emission areas EA2_1, the first type of third emission area EA3_1, and the second type of first emission area EA1_2, the second type of second emission areas EA2_2, and the second type of third emission area EA3_2. Further, for example, the auxiliary emission area and the auxiliary reflective emission area are not disposed in the first type of emission area EA1 in which the first type of first emission area EA1_1, the first type of second emission areas EA2_1, and the first type of third emission area EA3_1 are opposite to each other (e.g., face each other), but may be formed at the outside of the first type of emission area EA_1 which is opposite to the transmission area TA. However, it is not limited thereto. Further, for example, the auxiliary emission area and the auxiliary reflective emission area are not disposed in the second type of emission area EA2 in which the second type of first emission area EA1_2, the second type of second emission areas EA2_2, and the second type of third emission area EA3_2 are opposite to each other, but may be formed at the outside of the second type of emission area EA_2 which is opposite to the transmission area TA. However, it is not limited thereto.

The exemplary embodiments of the present disclosure can also be described as follows: According to an aspect of the present disclosure, there is provided a display device.

The display device comprises a display area which is divided into a first display area and a second display area, the first display area including a transmission area and a non-transmission area, a transistor disposed in the non-transmission area of the first display area, a planarization layer disposed above the transistor, a first bank which is disposed on the planarization layer and has a first open area and a second open area, an anode electrode which is disposed on a side portion of the first bank and the first open area and the second open area, a second bank which covers a part of the anode electrode and has a third open area and a fourth open area corresponding to the first open area and the second open area, respectively, a first organic layer and a second organic layer which are disposed on the anode electrode exposed by the third open area and the fourth open area, respectively, a cathode electrode which is disposed on the first organic layer and the second organic layer and an encapsulation layer disposed above the cathode electrode.

The first open area may have a width larger than that of the second open area and the third open area may have a width larger than that of the fourth open area.

When viewed in a planar perspective, the first open area and the third open area may have a circular shape and the second open area and the fourth open area have a ring shape which is partially cut out. The first bank may include a top surface and the side portion and the side portion may extend from the top surface of the first bank to a side surface.

The anode electrode may be disposed on a top surface and a side portion of the first bank and on the planarization layer and the anode electrode disposed in the first open area and the second open area may be in contact with the planarization layer.

The anode electrode may include a first area which is in contact with the planarization layer in the first open area and the second open area, a second area which extends from the first area to be in contact with the side portion of the first bank and a third area which extends from the second area to be in contact with the top surface of the first bank.

The first bank between the first open area and the second open area may configure a partition.

The anode electrode, the first organic layer, and the cathode electrode may configure a first light emitting diode and the anode electrode, the second organic layer, and the cathode electrode may configure a second light emitting diode.

The first light emitting diode may form a main emission area, the second light emitting diode may form an auxiliary emission area, and the auxiliary emission area may be formed around the main emission area.

The main emission area may correspond to the third open area and the auxiliary emission area may correspond to the fourth open area.

The anode electrode disposed in the side portion of the first bank around the third open area may form a main reflective emission area around the main emission area and the anode electrode disposed in the side portion of the first bank around the fourth open area may form an auxiliary reflective emission area around the auxiliary emission area.

A non-emission area may be formed by the partition between the main reflective emission area and the auxiliary emission area.

The second bank may include a top surface and a side portion to cover the second area and the third area of the anode electrode, the top surface of the second bank may correspond to the top surface of the first bank, and the side portion of the second bank may correspond to the side portion of the first bank.

The third open area and the fourth open area may be located in the first open area and the second open area.

The display device may further include a first pixel which is disposed in the non-transmission area of the first display area and a second pixel disposed in the second display area, the first pixel may be configured by a plurality of first sub pixels and the second pixel may be configured by a plurality of second sub pixels.

The first pixel may have pixels per inch (PPI) smaller than that of the second pixel.

In the first pixel, an auxiliary emission area, a main reflective emission area, and an auxiliary reflective emission area may be formed around the main emission area and the second pixel may be formed only in the main emission area.

The main emission area and the main reflective emission area may be formed in each of the plurality of first sub pixels and the auxiliary emission area and the auxiliary reflective emission area may not be formed in the first sub pixel, but may be formed at the outside of the first sub pixel which is opposite to the transmission area.

The main emission area may have a circular or an oval shape, the main reflective emission area may have a ring shape, and the auxiliary emission area and the auxiliary reflective emission area may have a ring shape which is partially cut out.

The anode electrode disposed in the side portion of the first bank around the first open area may be disposed in each of the plurality of first sub pixels and the anode electrode disposed in the side portion of the first bank around the second open area may not be disposed in the first pixel, but may be disposed at the outside of each of the plurality of first sub pixels which is opposite to the transmission area.

The display device may further include a light receiving device which overlaps the first display area.

According to another aspect of the present disclosure, there is provided a display device. The display device comprises a display area which is divided into a first display area and a second display area, the first display area including a transmission area and a non-transmission area, a first light emitting diode which is disposed in the non-transmission area and forms a main emission area, a second light emitting diode which is disposed around the first light emitting diode to form an auxiliary emission area, a main reflective emission area formed between the main emission area and the auxiliary emission area and an auxiliary reflective emission area formed around the auxiliary emission area.

The display device may further include a light receiving device which overlaps the first display area.

The display device may further include a first bank which is disposed in the non-transmission area and has a first open area and a second open area.

The first light emitting diode may include an anode electrode which is disposed in a side portion of the first bank and the first open area, a first organic layer which is disposed on the anode electrode exposed by a third open area corresponding to the first open area and a cathode electrode disposed on the first organic layer.

The second light emitting diode may include an anode electrode which is disposed in another side portion of the first bank and the second open area, a second organic layer which is disposed on the anode electrode exposed by a fourth open area corresponding to the second open area and a cathode electrode disposed on the second organic layer.

The anode electrode disposed in the side portion of the first bank around the third open area may form a main reflective emission area around the main emission area and the anode electrode disposed in another side portion of the first bank around the fourth open area may form an auxiliary reflective emission area around the auxiliary emission area.

A non-emission area may be formed by the first bank between the main reflective emission area and the auxiliary emission area.

Although the exemplary embodiments of the present disclosure have been described in detail with reference to the accompanying drawings, the present disclosure is not limited thereto and may be embodied in many different forms without departing from the technical concept of the present disclosure. Therefore, the exemplary embodiments of the present disclosure are provided for illustrative purposes only but not intended to limit the technical concept of the present disclosure. The scope of the technical concept of the present disclosure is not limited thereto. Therefore, it should be understood that the above-described exemplary embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a display area including a first display area and a second display area, the first display area including a transmission area and a non-transmission area;

a transistor in the non-transmission area of the first display area;

a planarization layer above the transistor;

a first bank on the planarization layer, the first bank including a first open area and a second open area;

an anode electrode on a side portion of the first bank, the first open area, and the second open area;

a second bank that covers a part of the anode electrode on the side portion of the first bank and includes a third open area and a fourth open area, the third open area overlapping the first open area and the fourth open area overlapping the second open area;

a first organic layer on the anode electrode in the third open area and a second organic layer on the anode electrode in the fourth open area;

a cathode electrode on the first organic layer and the second organic layer; and an encapsulation layer on the cathode electrode, wherein the transmission area is free of any light emitting diode.

2. The display device according to claim 1, wherein the first open area has a width that is wider than a width of the second open area, and the third open area has a width that is wider than a width of the fourth open area.

3. The display device according to claim 1, wherein the first open area and the third open area have a circular shape in a planar view of the display device and the second open area and the fourth open area have a ring shape.

4. The display device according to claim 1, wherein the first bank includes a top surface and the side portion is a side surface of the first bank that extends from the top surface of the first bank.

5. The display device according to claim 4, wherein the anode electrode is on the top surface of the first bank, the side portion of the first bank, and on the planarization layer, and the anode electrode that is in the first open area and the second open area is in contact with the planarization layer.

6. The display device according to claim 4, wherein the anode electrode includes:

a first area in contact with the planarization layer in the first open area and the second open area;

a second area that extends from the first area and is in contact with the side portion of the first bank; and a third area that extends from the second area and is in contact with the top surface of the first bank.

7. The display device according to claim 6, wherein a portion of the first bank that is between the first open area and the second open area is a partition that separates the first open area from the second open area.

8. The display device according to claim 7, wherein a first light emitting diode includes a first portion of the first area of the anode electrode in the first open area, the first organic layer on the first portion of the anode electrode, and a first portion of the cathode electrode that is on the first organic layer, and a second light emitting diode includes a second portion of the first area of the anode electrode in the second open area, the second organic layer on the second portion of the anode electrode, and a second portion of the cathode electrode on the second organic layer.

9. The display device according to claim 8, wherein the first light emitting diode is a main emission area and the second light emitting diode is an auxiliary emission area around the main emission area.

10. The display device according to claim 9, wherein the main emission area corresponds to the third open area and the auxiliary emission area corresponds to the fourth open area.

11. The display device according to claim 9, wherein the first portion of the anode electrode on the side portion of the first bank is around the third open area and is a main reflective emission area that is around the main emission area, and the second portion of the anode electrode on a side portion of the first bank around the fourth open area is an auxiliary reflective emission area that is around the auxiliary emission area.

12. The display device according to claim 11, wherein a non-emission area corresponding to the partition is between the main reflective emission area and the auxiliary emission area.

13. The display device according to claim 6, wherein the second bank includes a top surface and a side portion that cover the second area and the third area of the anode electrode, the top surface of the second bank overlaps the top surface of the first bank, and the side portion of the second bank overlaps the side portion of the first bank.

14. The display device according to claim 1, wherein the third open area is in the first open area and the fourth open area is in the second open area.

15. The display device according to claim 1, further comprising:

a first pixel in the non-transmission area of the first display area; and a second pixel disposed in the second display area, wherein the first pixel includes a plurality of first sub pixels and the second pixel includes a plurality of second sub pixels.

16. The display device according to claim 15, wherein the first pixel has a pixels per inch (PPI) that is less than a PPI of the second pixel.

17. The display device according to claim 15, wherein the first pixel includes an auxiliary emission area, a main reflective emission area, and an auxiliary reflective emission area around a main emission area, and the second pixel includes a main emission area but does not include an auxiliary emission area, a main reflective emission area, and an auxiliary reflective emission area.

18. The display device according to claim 17, wherein the main emission area and the main reflective emission area are included in each of the plurality of first sub pixels and the auxiliary emission area and the auxiliary reflective emission area are around a first portion of the first sub pixel that faces the transmission area without being around a second portion of the first sub pixel that faces other first sub pixels.

19. The display device according to claim 17, wherein the main emission area has a circular or an oval shape, the main reflective emission area has a ring shape, and the auxiliary emission area and the auxiliary reflective emission area have a ring shape which is partially cut out.

20. The display device according to claim 15, wherein a first portion of the anode electrode on the side portion of the first bank is around the first open area in a first sub pixel of the plurality of first sub pixels and a second portion of the anode electrode on the side portion of the first bank is around the second open area and is outside of the first sub pixel and faces the transmission area.

21. The display device according to claim 1, further comprising:

a light receiving device that overlaps the first display area but not the second display area.

22. A display device, comprising:

a display area including a first display area and a second display area, the first display area including a transmission area and a non-transmission area;

a first light emitting diode in the non-transmission area, the first light emitting diode being a main emission area that emits light;

a second light emitting diode around the first light emitting diode, the second light emitting diode being an auxiliary emission area that emits light;

a main reflective emission area between the main emission area and the auxiliary emission area, the main reflective emission area reflecting the light emitted from the main emission area; and an auxiliary reflective emission area around the auxiliary emission area, the auxiliary reflective emission area reflecting the light emitted from the auxiliary emission area.

23. The display device according to claim 22, further comprising:

a light receiving device that overlaps the first display area without overlapping the second display area.

24. The display device according to claim 22, further comprising:

a first bank in the non-transmission area, the first bank including a first open area and a second open area.

25. The display device according to claim 24, wherein the first light emitting diode includes:

an anode electrode including a first portion that is on a first side portion of the first bank and the first open area;

a first organic layer on the first portion of the anode electrode exposed by a third open area that overlaps the first open area; and a first portion of a cathode electrode on the first organic layer.

26. The display device according to claim 25, wherein the second light emitting diode includes:

a second portion of the anode electrode that is on a second side portion of the first bank and the second open area;

a second organic layer on the second portion of the anode electrode exposed by a fourth open area that overlaps the second open area; and a second portion of the cathode electrode on the second organic layer.

27. The display device according to claim 26, wherein the first portion of the anode electrode on the first side portion of the first bank around the third open area is a main reflective emission area around the main emission area and the second portion of the anode electrode on the second side portion of the first bank around the fourth open area is an auxiliary reflective emission area around the auxiliary emission area.

28. The display device according to claim 27, wherein a portion of the first bank between the main reflective emission area and the auxiliary emission area is a non-emission area.

29. A display device comprising:

a display area including a first display area and a second display area, the second display area less light transmissive than the first display area;

a transistor in the first display area;

a planarization layer on the transistor in the first display area;

a first bank in the first display area, the first bank including a first open area such that the first bank includes a first top surface and a first side surface that extends from the first top surface to the planarization layer;

an anode electrode that is connected to the transistor, the anode electrode including a first portion that is on the first side surface of the first bank and contacts a first portion of the planarization layer in the first open area;

a second bank over the first portion of the anode electrode that is on the first side surface of the first bank, the second bank including a second open area that overlaps the first open area;

a first organic layer on the first portion of the anode electrode in the second open area; and a cathode electrode including a first portion that is on a first side surface of the second bank and on the first organic layer.

30. The display device of claim 29, wherein the first bank further comprises a third open area such that the first bank includes a second top surface and a second side surface that extends from the second top surface to the planarization layer, wherein a second portion of the anode electrode is on the second side surface of the first bank and contacts a second portion of the planarization layer in the third open area, and wherein the second bank is over the second portion of the anode electrode that is on the second side surface of the first bank, and the second bank includes a fourth open area that overlaps the third open area.

31. The display device of claim 30, further comprising:

a second organic layer on the second portion of the anode electrode in the fourth open area, wherein a second portion of the cathode electrode is on a second side surface of the second bank and on the second organic layer.

* * * * *